(12) United States Patent
Angel et al.

(10) Patent No.: US 11,177,767 B2
(45) Date of Patent: Nov. 16, 2021

(54) SOLAR PV GENERATOR WITH DISH REFLECTOR AND FLY'S EYE RECEIVER

(71) Applicant: THE ARIZONA BOARD OF REGENTS ON BEHALF OF THE UNIVERSITY OF ARIZONA, Tucson, AZ (US)

(72) Inventors: Roger P. Angel, Tucson, AZ (US); Justin J. Hyatt, Tucson, AZ (US); Dmitry Reshidko, Redmond, WA (US); Brian M. Wheelwright, Sammamish, WA (US); Nicholas J. Didato, Tucson, AZ (US)

(73) Assignee: THE ARIZONA BOARD OF REGENTS ON BEHALF OF THE UNIVERSITY OF ARIZONA, Tucson, AZ (US)

( * ) Notice: Subject to any disclaimer, the term of this patent is extended or adjusted under 35 U.S.C. 154(b) by 0 days.

(21) Appl. No.: 16/610,358

(22) PCT Filed: May 1, 2018

(86) PCT No.: PCT/US2018/030491
§ 371 (c)(1),
(2) Date: Nov. 1, 2019

(87) PCT Pub. No.: WO2018/204388
PCT Pub. Date: Nov. 8, 2018

(65) Prior Publication Data
US 2020/0091863 A1    Mar. 19, 2020

Related U.S. Application Data

(60) Provisional application No. 62/500,306, filed on May 2, 2017.

(51) Int. Cl.
*H02S 40/22* (2014.01)
*H02S 20/30* (2014.01)
(Continued)

(52) U.S. Cl.
CPC .............. *H02S 40/22* (2014.12); *H02S 20/30* (2014.12); *H02S 30/10* (2014.12); *H02S 40/425* (2014.12)

(58) Field of Classification Search
CPC ........ H02S 40/22; H02S 40/425; H02S 20/30; H02S 20/32; H02S 30/10; Y02E 10/52; H01L 31/0543
See application file for complete search history.

(56) References Cited

U.S. PATENT DOCUMENTS

| 2008/0185034 | A1* | 8/2008 | Corio | H01L 31/048 136/246 |
|---|---|---|---|---|
| 2012/0192919 | A1* | 8/2012 | Mizuyama | H01L 31/0543 136/246 |

(Continued)

OTHER PUBLICATIONS

Silva, Routine operation of the envirodish unit at the engineering school of the University of Sevilla, 2006.*
(Continued)

*Primary Examiner* — Matthew T Martin
(74) *Attorney, Agent, or Firm* — Snell & Wilmer L.L.P.

(57) ABSTRACT

An apparatus for generating electricity from solar energy has a large dish reflector with a fly's eye receiver positioned near the focus of the dish reflector, held by a dual axis tracking structure. The fly's eye receiver includes a field lens that concentrates sunlight into an image of the dish reflector, a two-dimensional fly's eye array of contiguous convex lenses extending across the dish image, and a photovoltaic cell behind each convex lens of the fly's eye array. Two imaging stages are provided. First, the dish reflector and the field lens concentrate the sunlight in the form of an image of the dish
(Continued)

that is stabilized against pointing errors of the tracking mechanism. Second, the contiguous array of convex lenses divides the sunlight energy of the dish image into portions, one per convex lens, each portion being further concentrated by the respective convex lens onto a corresponding photovoltaic cell.

13 Claims, 27 Drawing Sheets

(51) Int. Cl.
  *H02S 30/10* (2014.01)
  *H02S 40/42* (2014.01)

(56) References Cited

U.S. PATENT DOCUMENTS

| | | | |
|---|---|---|---|
| 2013/0068285 A1 | 3/2013 | Ni et al. | |
| 2013/0294045 A1* | 11/2013 | Morgenbrod | F21V 5/004 |
| | | | 362/1 |
| 2014/0261392 A1 | 9/2014 | Lambrecht | |
| 2015/0303867 A1* | 10/2015 | Angel | H02S 20/32 |
| | | | 136/246 |

OTHER PUBLICATIONS

International Search Report and Written Opinion dated Sep. 18, 2018 from corresponding International Application PCT/US2018/030491.

\* cited by examiner

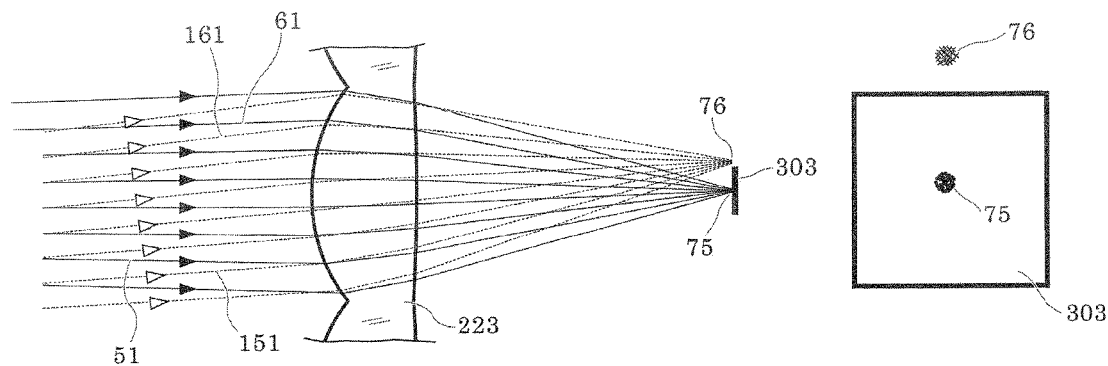 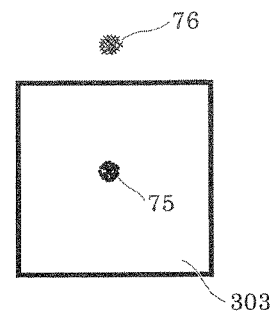
Fig. 7a Fig. 7c
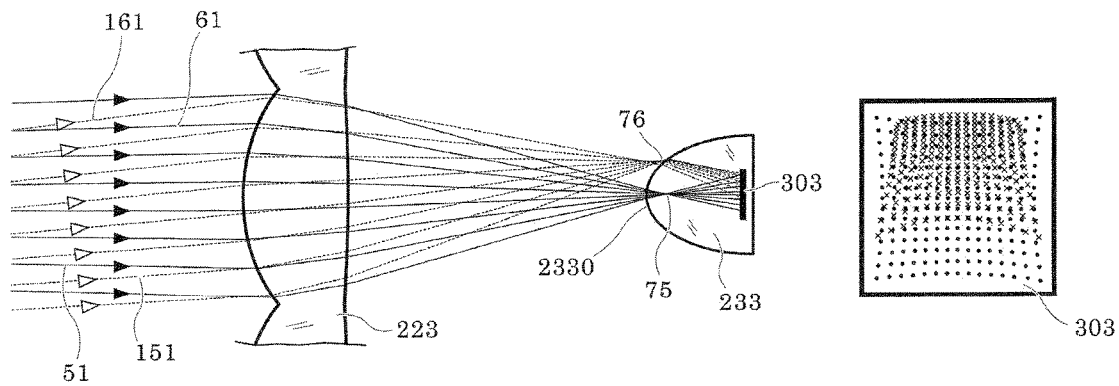 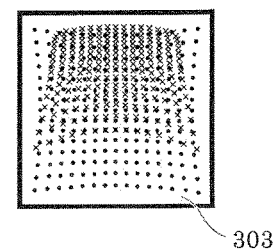
Fig. 7b Fig. 7d
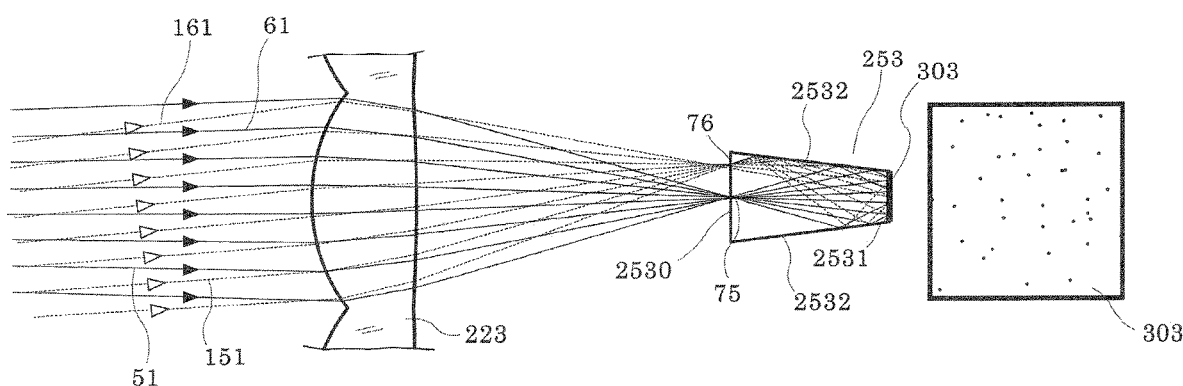
Fig. 7e Fig. 7f

SOLAR PV GENERATOR WITH DISH REFLECTOR AND FLY'S EYE RECEIVER

CROSS REFERENCE TO RELATED APPLICATIONS

This application is a U.S. National Phase filing under 35 U.S.C. § 371 of PCT/US2018/030491, filed on May 1, 2018, which claims priority to U.S. Provisional Patent Application Ser. No. 62/500,306, filed on May 2, 2017, both of which are incorporated herein by reference.

FIELD

The present invention relates to the generation of solar electrical power using a large dish reflector to power multijunction photovoltaic cells.

BACKGROUND

In the past, single junction photovoltaic ("PV") cells have been widely used to convert sunlight into electricity. The efficiency of conversion of the total amount of incident solar energy is at best a little more than 20% conversion in current commercial PV modules. This limitation on the efficiency of conversion arises because conventional PV modules use a single semiconductor type. While any given semiconductor may convert with high efficiency at a given characteristic wavelength, it is less efficient at other wavelengths across the solar spectrum, and typically can convert only a small amount of the available solar energy into electricity.

A PV system with higher efficiency across the spectrum is preferred over a conventional module, provided the overall cost is not increased so much as to offset the efficiency gain. Sunlight may be converted into electricity with higher overall efficiency than is possible with any one semiconductor, by dividing the solar spectrum and using the different parts to power a PV cell comprising two or more semiconductors, each cell being illuminated preferentially by those parts of the spectrum which it converts with highest efficiency. The different semiconductors may be stacked on top of each other, forming a multijunction cell. In a multijunction cell, different spectral bands separate out by absorption as sunlight travels down through the stack. Multijunction cells have been commercially developed and are widely used to power spacecraft. However, this multijunction approach is limited to expensive semiconductors and manufacturing techniques. To reduce the overall cost, for terrestrial energy generation a small multijunction cell may be used in conjunction with optics which collect a larger area of direct sunlight and strongly focus it onto the smaller cell area.

Operated under sunlight at high concentration, such cells may realize twice the conversion efficiency of conventional cells and, since a much smaller cell area is needed to convert sunlight that has been highly concentrated, cell cost may be several times less than conventional PV cells, per unit of power output.

In the past, there have been solar generators that aimed at exploiting the very high efficiency of multi junction solar cells where the solar generators employed many small focusing optical systems, each one focusing incoming sunlight onto a single small cell. Typically, many optical systems and cells were assembled into a module. The cells were typically cooled by natural convection, requiring a substantial mass of thermal conductor, such as aluminum. However, such assemblies, which include individual focusing optics, concentrators, cells, heatsinks and supporting structure, tended to be large, heavy and complex, driving up cost of manufacture and transportation. Also the most commonly used focusing optic, a Fresnel lens, loses some light by scattering and has chromatic aberration, which may upset the spectral balance of focused sunlight, and both effects contribute toward a reduced conversion efficiency. Overall costs of electrical energy generated by installations having such large, heavy and complex concentrating photovoltaic ("CPV") modules have not proved competitive with those using conventional PV modules.

In the past, some designs of CPV generators have been disclosed that avoid the complexity and cost of large CPV modules by collecting sunlight with a single large focusing dish reflector and focusing it onto a small package containing many multi junction photovoltaic cells in a densely packed array. One example is U.S. Patent Application No. 2011/0168234, to Lasich. Such systems may however suffer from uneven distribution of concentrated sunlight among the cells, especially if the solar tracking is not accurate. Uneven distribution of sunlight leads to loss of efficiency. Efficiency is also reduced when cells are packaged close together to form a dense array, because light is lost in any gaps between the cells and at light-insensitive electrical busbars at the cell perimeter.

A dish-based concentrating photovoltaic solar generator that mitigates many of these difficulties has been disclosed by Angel in U.S. Pat. No. 8,350,145B2, and by Angel et al., in U.S. Patent Application No. US 2015/0303867 A1. In these inventions, a spherical or other short focus lens, preferably of fused silica, is introduced near the focus of a paraboloidal dish to image the dish at high concentration onto an array of slightly separated cells. Secondary roof reflectors between the cells direct the light away from the gaps between the cells and onto their photovoltaically active areas. However, some practical difficulties that increase cost may remain. One is that the secondary reflectors may absorb a few percent of the highly concentrated sunlight to which they are exposed, reducing efficiency, and they may need active cooling, increasing complexity. Efficiency and tolerance to mispointing may also be reduced by the increased angles of incidence on the cells of the reflected light. The short focus fused silica lens placed near the dish focus may also present some difficulties: it may have steeply curved surfaces and be thick, increasing weight and cost. Also its steep curvature may cause strong spherical aberration. As a result, if the dish is inadvertently mispointed, focused sunlight entering toward the edge of the lens may be refracted away from the cells and present a problem for thermal management. A further difficulty has been in minimizing the reflection losses of a silica lens over the very broad spectral band of multijunction cells. Additional difficulties may arise from there being little room to space the cells apart, especially if they are small, as preferred for high efficiency. As a result, wiring between the cells may be constricted. Also, cooling of closely spaced cells may be complicated by the high average density of heat to be removed, requiring pumped liquid coolant that may add further to complexity and cost.

In the past, the cost of the dual axis trackers used to orient CPV generators to the sun has been relatively high, and has contributed to their not being commercially competitive with electrical generation by PV panels on single axis trackers. The dual axis trackers used have been almost exclusively used on a post surmounted by a slewing bearing to provide azimuthal rotation. Such mountings are also used extensively for heliostats for thermal generation.

However, dual axis trackers of this type have employed heavy steel construction in an attempt to prevent damage by strong forces and moments from rare strong winds. In an effort to realize a more efficient tracker that spreads the load more broadly to reduce stresses and moments, and hence mass and cost, in the past, dual axis trackers have been proposed in which azimuth motion is made by wheels turning on a circular track, with the potential for a more efficient structure with less mass and cost.

Vindum (U.S. Pat. No. 4,256,088) describes a wheeled dual axis tracker with a solar reflector structure supported in part from a circular rail, and in part from a central ground foundation by a telescoping linear actuator. The rail supports the elevation axis on a wheeled rotating structure which takes most of the weight when the reflector structure points to the horizon, while a hydraulic actuator drives the structure in elevation, taking most of its weight when the reflector structure points to the zenith. A problem with this design is that the requirement of long extension required of the linear actuator leads to the use of hydraulics in a multi-section unit, driving up capital and maintenance costs.

Another design for a dual axis solar tracker that turns on wheels on a rail is described by Moore (U.S. Pat. No. 4,649,899). In this case, the elevation axis is supported on a square structure with 4 wheels, and the elevation drive is via a screw actuator on the square structure. Yet another design for a rail-mounted tracker is by Angel and Davison (U.S. Pat. No. 8,430,090).

A common deficiency of the above rail track designs is the mass and cost of the steel rail used to constrain lateral translation of the tracker.

A design that avoids the need for a rail, and uses a flat circular track on the ground, has been described by Cabanillas (U.S. Pat. No. 8,237,098). In this design, a wheeled dual axis tracker is supported in part by the circular track and in part by a central support that takes some of the vertical load and also constrains lateral motion, avoiding the need for a rail. The design has four wheels, one projecting forward (a nose wheel). To avoid distortion of the four-wheeled rotating structure by irregularities in the circular track, the structure is articulated, with articulated lattice girders reaching out to the four wheels. The girders are hinged at the center post to accommodate vertical displacements of the wheels. But these features have driven up complexity and cost, making this design uncompetitive in practice.

In view of these challenges and difficulties, the long-felt need for better efficiency of solar conversion at lower cost, and to simplify and reduce the cost of dual axis tracker support, continues to leave room for improvement over the prior art.

SUMMARY

It is an object of the present invention to improve the efficiency and reduce the production cost of PV solar electricity generators, by concentrating sunlight in a two-stage process before its conversion into electricity by small, highly efficient multijunction PV cells. Such two-stage concentration allows the collection function to be performed by a large, inexpensive reflector mounted on a lightweight tracker, while division of the collected sunlight into equal portions for each of the cells, (for simple and efficient series electrical connection), is made not on its first entering the system, as is the case for nearly all past PV and CPV systems, but at smaller scale following the first stage of concentration. It is an object to package the small cells and apportioning optics into a receiver module that is smaller and less expensive to manufacture than a conventional PV panel or CPV module of the same power, and which may also be upgraded at low cost. The receiver is co-mounted with a large area concave dish reflector on a dual axis tracker. It is a further object that the optical system use imaging optics exclusively to concentrate the sunlight in the first stage of concentration, so as to preserve optical etendue and thus minimize losses from tracker mispointing. It is also an object to manufacture the lenses in a way that minimizes surface reflection losses, so as to maximize optical throughput and system efficiency. It is further an object that optics provide for sufficient separation between the individual multijunction cells so as to facilitate electrical wiring, and also to reduce the heat flux averaged across the cell array, so that if thermal output is not required, forced air convection may be advantageously used to cool the cells rather than recirculated liquid.

It is a further object of the present invention to provide a dual axis tracker design that is structurally more efficient in its use of steel, and inexpensive to manufacture and install in the field.

In accordance with the present invention, a solar electric generator is disclosed in which sunlight is concentrated in two successive stages onto multi junction PV cells. The first stage of concentration is accomplished by a large, concave reflector acting together with a field lens near its focus that forms the entrance to a small receiver. A stabilized pupil image of the reflector formed within the receiver by the field lens marks the first stage of concentration, which may be approximately 10-50 times that of natural sunlight. After this first stage of concentration, the area of concentrated light has a sharp and stable boundary, facilitating division onto PV cells.

In accordance with the present invention, the second stage of concentration is made by a "fly's eye" lens array. For purposes of this invention, a "fly's eye" lens array is a multiplicity of contiguous small convex lenses located at said pupil image. As in a compound insect eye, each lens of the fly's eye lens array focuses light on a receptor behind. In our case, the receptors are small, separated multijunction PV cells. The lenses are individually sized in order to apportion the light from the pupil image in equal amounts to the multijunction cells. The additional second stage concentration, provided by each lens of the array focusing light down onto the cell behind, may be a factor of 10-50. The total concentration from both stages operating together is thus in the range of approximately 100-2500.

The field lens near the dish focus and the subsequent fly's eye lens array and multijunction PV cells are packaged together to form a small receiver. The receiver and the large dish reflector are rigidly held in co-alignment, the assembly being oriented to the sun through the day by a dual axis tracker.

The large concave reflector in this generator is preferably an off-axis section of a paraboloidal dish, configured so that the fly's eye receiver does not obscure the sunlight coming into the reflector. The reflector may be assembled from one or more off-axis shaped mirror segments on a supporting structure. The focal ratio of the off-axis paraboloid, i.e., the ratio of its focal length to its diameter (or width if not circular), may be chosen to be in the range f/0.5 to f/2. One or more reflectors, each with a receiver at its focus, may be carried on one dual-axis tracker.

In accordance with the present invention, the fly's eye receiver placed near the reflector focus has a field lens at its entrance. This lens forms a pupil image of the reflector on the fly's eye lens array. The optical power of the field lens is chosen according to the desired amount of first stage optical concentration at the fly's eye lens array. For example, if an average concentration of 25× is desired, the pupil image formed by the lens must be about ⅕ the size of the primary concave reflector. The field lens forms a pupil image of the reflector on a concave surface, whose position and light distribution is largely stabilized against tracker mispointing. The diameter of the field lens will depend on the focal ratio of the primary reflector and the desired angular acceptance for mispointing for the first stage of concentration. For example, if the primary focal ratio is f/1 and the mispointing tolerance is ±1°, then the diameter of the field lens must be at a minimum ½₅ that of the reflector, depending on the positioning of the lens. The field lens may form a sealed entrance window to an enclosure that protects the following optics and cells against moisture and soiling.

Within the fly's eye receiver, the first-stage concentrated sunlight formed as a pupil image by said field lens is divided and further concentrated in a second stage by the fly's eye lens array. The array may have overall an approximately concave spherical shape, the center of said sphere being near the field lens. Such centration will ensure that the rays of first-stage concentrated sunlight entering any one of the lenses of the array will, when there is no pointing error, be aligned with the axis of that lens, and will be brought to a focus on that axis. The lenses of the fly's eye array are made contiguous, with minimal loss at gaps between the lenses, so that virtually all the first stage concentrated sunlight energy at the pupil is divided and transmitted by the fly's eye array for second stage concentration onto the cells.

Since the flux of concentrated light after the first stage varies uniformly across the array, being strongest at the furthest point from the parent paraboloid axis, the lenses are sized with different areas so that the sunlight power focused by any individual lens is the same for all. The electrical current from all the cells will then be substantially the same, allowing for efficient series connection.

The PV cells at the focus of each lens of the fly's eye array may be of the multijunction type, to provide very high efficiency conversion of highly concentrated sunlight into electricity. The cells may be small, 6 mm or smaller, to minimize electrical Joule losses. As an example, 5 mm square cells might be illuminated by 25 mm square fly's eye lenses. The second stage concentration, the ratio of the lens to cell areas, would then be 25×.

Each cell may be operated directly at or near the focus of a fly's eye lens. Alternatively, a tertiary optical element such as a dome lens or optical funnel may be placed in optical contact with or directly above each cell, to more uniformly distribute the concentrated light across the cell, and also to increase mispointing tolerance. A dome lens may form an image on the lens element of the fly's eye array that precedes it.

Both the dome lenses and the fly's eye lenses will preferably have high transparency across the parts of the solar spectrum which are converted by the multijunction cells, so as to avoid spectral imbalances and loss of power. Also, their absorption at longer wavelengths of the solar spectrum should preferably be low enough to avoid significant heating of the lenses.

Minimizing surface reflection at the field lens is key to maintaining high optical transmission and overall conversion efficiency of this invention. It may be accomplished by an advanced coating process disclosed in this invention, in which double sol-gel layers provide very low reflection loss over the very wide spectral bandwidth of multi junction PV cells.

Very low reflection at the surfaces of the fly's eye and dome lenses, in addition to the field lens, is important to maintaining high optical transmission and overall conversion efficiency of this invention. It may be preferably accomplished by making these lenses of borosilicate glass that has been phase separated and then leached in acid. This process is described below as part of this disclosure, but the described process may have advantageous applications that are independent of the solar energy generator described herein.

The cells and dome lenses may be mounted individually on ceramic circuit cards which combine high electrical resistance and thermal conductivity. The electrical outputs from the circuit cards may be connected in series.

To ensure that the cells operate at highest efficiency, they are preferably cooled. Heat generated in the cells by the concentrated sunlight may be conducted away through the ceramic circuit cards and through a concave bowl of high conductivity material, such as aluminum or copper. The bowl may also form the supporting structure of the fly's eye receiver, holding the cell circuit cards and tertiary optical elements correctly centered under the lenses. The conductive bowl may be cooled from behind either by a heat transfer fluid, or by forced air convection acting on finned structures. Convective air cooling from behind is enabled by the relatively low heat density of the first stage of concentration of this invention. In this invention, the heating at the conductive supporting structure is set by the average concentration which may be only 25×, compared with 600× if the cells were densely packed. Thus, one advantage of the present invention is the relatively low heat density properties of this approach to concentration, which has cost advantages and favorable operational characteristics.

In accordance with the present invention, a dual axis tracker of elevation over azimuth design is provided that minimizes cost of manufacture and field installation. Its azimuth structure is a rigid triangular spaceframe supported at its three corners by wheels, one or more being driven. Four of the six degrees of freedom of rigid body motion of the azimuth structure are constrained by the position of the wheels on the track: vertical displacement (z), tip, tilt and azimuth rotation. A central ground bearing constrains the remaining two degrees of motion, namely lateral displacement (x and y). The central bearing also restrains upward motion in high wind, but takes no downward load. In this design, the azimuthal rotation axis may be as much as several degrees off vertical, and the track not especially flat, to reduce cost, nevertheless any orientation needed for heliostat or sun pointing may be achieved by choosing the correct angles of rotation around the track and about the elevation axis. To allow accurate tracking as a heliostat, the tracker may be provided with level sensors and encoders for elevation and rotation about the central bearing. For direct pointing to the sun, as needed for the fly's eye generator, a sun position sensor is provided. To reduce the cost of on-site assembly, the spaceframe structures will be largely prefabricated and shipped as major flat subassemblies with pre-manufactured nodes, to be connected with the lightweight struts in the field.

BRIEF DESCRIPTION OF THE DRAWINGS

FIG. 7a shows rays before the addition of a dome lens placed on a cell.

FIG. 7b shows rays after the addition of a dome lens placed on a cell.

FIG. 7c shows a magnified plan view of the photovoltaic cell shown in FIG. 7a, illustrating in more detail the central focus of sunlight for on-axis rays, and the displaced focus of sunlight for off-axis rays, in an example illustrating the effects of mispointing without a dome lens.

FIG. 7d shows a magnified plan view of the photovoltaic cell shown in FIG. 7b, illustrating in more detail the focus of sunlight for on-axis rays, and the focus of sunlight for off-axis rays, in an example illustrating the effects of mispointing with a dome lens.

FIG. 7e shows rays after the addition of an optical funnel placed on a cell.

FIG. 7f shows a magnified plan view of the photovoltaic cell shown in FIG. 7e, illustrating in more detail the focus of sunlight for both on- and off-axis rays, in an example illustrating the effects of mispointing with a funnel lens.

FIG. 15b shows a ray trace diagram for the same specific first stage concentrator referenced in FIG. 15a.

FIG. 17b shows a side view of the generator illustrated in FIG. 17a.

DETAILED DESCRIPTION

Figure 1:
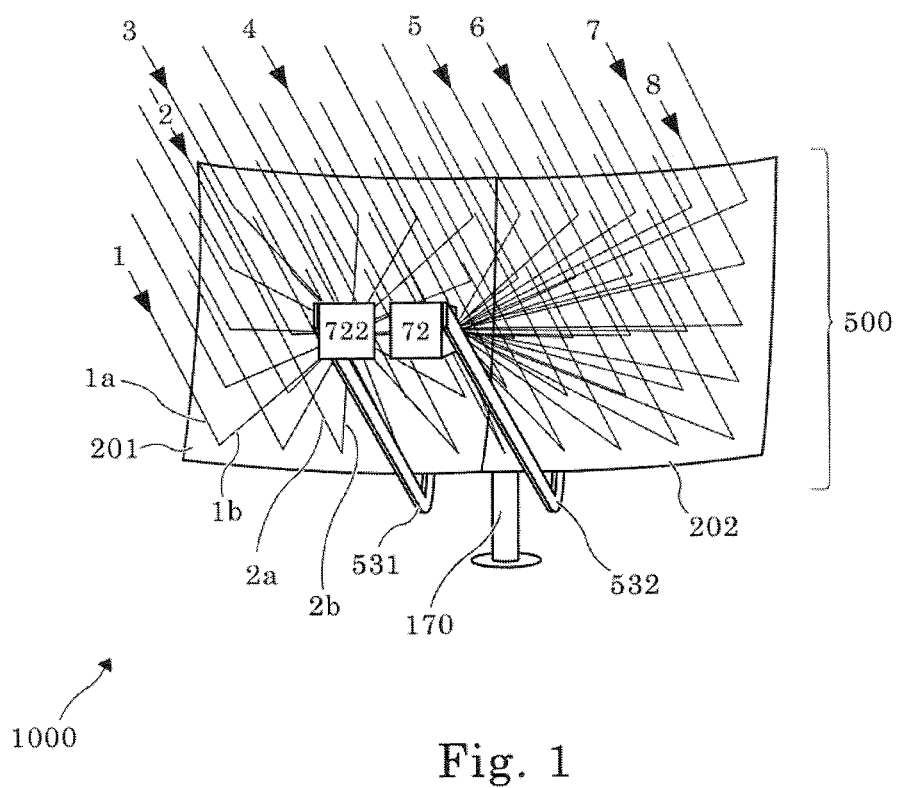
FIG. 1 is a perspective view of a preferred embodiment of the invention with adjacent large square reflectors and receivers.

FIG. 1 is a perspective view of a preferred embodiment of the invention, a generator 1000 with two adjacent large square reflectors 201 and 202. Sunlight rays striking the first reflector 201, such as rays 1, 2, 3 and 4, are focused into a first receiver 722, where they are converted into electricity. Similarly rays striking the second reflector 202, such as rays 5, 6, 7 and 8, are focused into a second receiver 72. The first and second receivers 722 and 72 are fixed in position relative to the first and second reflectors 201 and 202, respectively, by a first arm 531 and a second arm 532, and are positioned to receive all reflected rays, but are positioned below any incoming rays. For example, the first receiver 722 is position so that it receives reflected ray 1b without blocking incoming ray 1a. Similarly, the first receiver 722 is position so that it receives reflected ray 2b without blocking incoming ray 2a.

The assembly of reflectors, receivers and connecting supports together comprise the elevation structure 500, which is oriented to the sun by azimuth and elevation bearings (not visible in FIG. 1) supported atop a fixed post or support 170.

Figure 2:
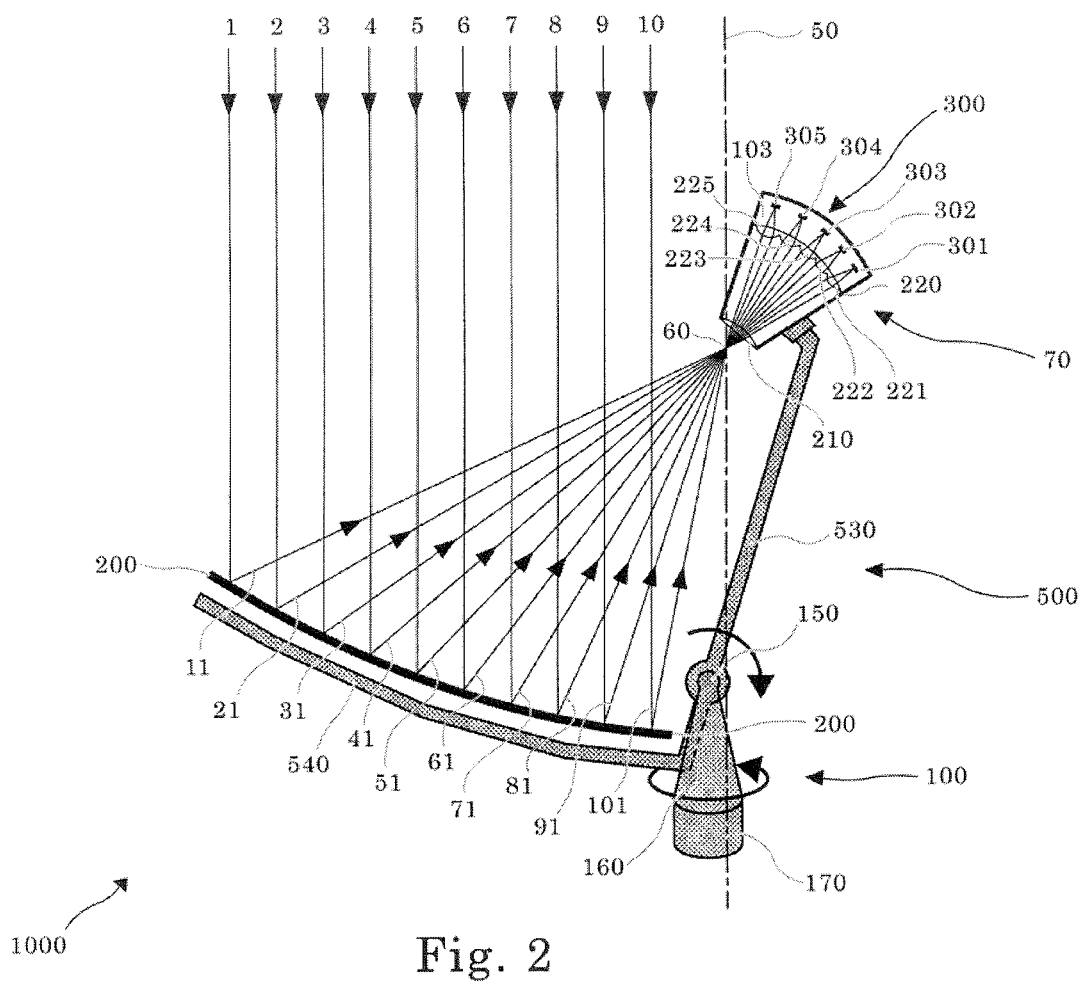
FIG. 2 is a schematic cross-sectional view of one of the square reflectors and the associated receiver of FIG. 1, showing paths of on-axis rays in a preferred embodiment of the generator.

FIG. 2 is a schematic cross section showing light ray paths in a preferred embodiment of a solar generator 1000 according to the present invention. The receiver 70 illustrated in FIG. 2 may represent either the first receiver 722 or the second receiver 72 shown in FIG. 1, because both the first receiver 722 and the second receiver 72 are preferably the same. As shown in FIG. 2, entering parallel rays of light 1, 2, 3, 4, 5, 6, 7, 8, 9, and 10, respectively, strike the reflector 200 and are directed and concentrated into the receiver 70. With the generator correctly oriented to the sun, entering rays 1, 2, 3, 4, 5, 6, 7, 8, 9, and 10, respectively, strike the reflector 200, and are reflected as reflected rays 11, 21, 31, 41, 51, 61, 71, 81, 91, and 101, respectively. Reflected rays 11, 21, 31, 41, 51, 61, 71, 81, 91, and 101, respectively, enter the receiver 70 through a lens 210 and pass through a fly's eye lens array 220, to be converted into electricity by a plurality of photovoltaic cells 301, 302, 303, 304, and 305. For convenience, the photovoltaic cells 301, 302, 303, 304, and 305 will sometimes be referred to merely as "cells," it being understood by persons skilled in the art in the context of this description that a "cell" refers to a photovoltaic cell, or in a preferred embodiment, more specifically a multijunction photovoltaic cell.

The rigid elevation structure 500 holds the fly's eye receiver 70 at a substantially fixed orientation to the reflector 200. The rigid elevation structure 500 comprises a mirror support 540 connected to the receiver 70 by an arm 530. The rigid elevation structure 500 may be rotated to orient the generator to the sun, as the sun moves during the day, by a dual-axis tracking mount 100 set upon a fixed support 170. Rotation about a horizontal axis is by an elevation bearing 150, which in turn is rotated about a vertical axis by an azimuth bearing and drive 160.

In a preferred embodiment, the entering reflector 200 is an off-axis segment of a paraboloid with axis 50, causing the rays 1, 2, 3, 4, 5, 6, 7, 8, 9, and 10, shown parallel to the axis 50, to converge to the focus 60 of the paraboloid, as indicated in FIG. 2 by converging rays 11, 21, 31, 41, 51, 61, 71, 81, 91, and 101. The entering reflector 200 is located to the side of the paraboloid axis 50 so that, as shown, the incoming sunlight rays 1, 2, 3, 4, 5, 6, 7, 8, 9, and 10, are not blocked by the fly's eye receiver 70.

The entering rays of sunlight 1, 2, 3, 4, 5, 6, 7, 8, 9, and 10, as shown in FIG. 1, are shown equally spaced to represent equal amounts of sunlight power. These rays after striking the reflector 200 are reflected to a focus 60 as rays 11, 21, 31, 41, 51, 61, 71, 81, 91, and 101, respectively. These reflected rays 11, 21, 31, 41, 51, 61, 71, 81, 91, and 101, enter the receiver 70 through the field lens 210.

The receiver lenses include the field lens 210 and the fly's eye lens array 220. The receiver lenses (the field lens 210 and the fly's eye lens array 220) in this invention are configured so as to divide all the entering focused sunlight power into a multiplicity of equal portions, each portion directed to an individual multijunction cell 301, 302, 303, 304, and 305, respectively, for conversion into electricity.

Figure 3:
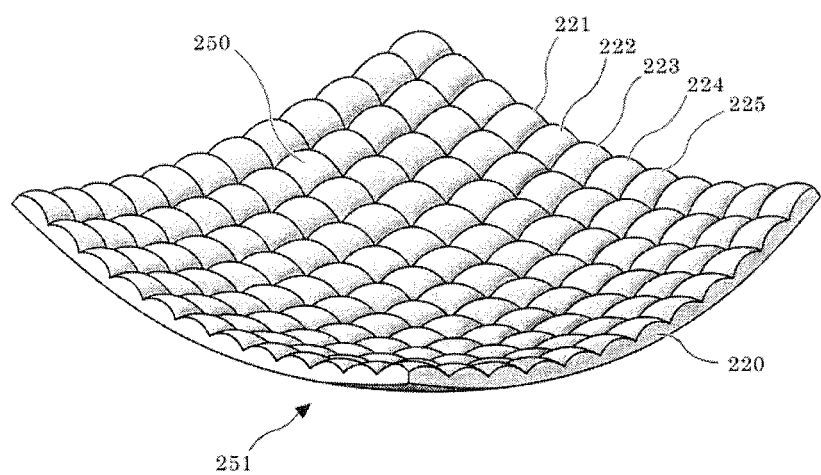
FIG. 3 is a perspective view of a fly's eye lens array.

In conventional PV modules with no concentration, equal division is accomplished by making large PV cells of equal size, and placing them close together to avoid wasting sunlight. In the receiver 70 of this invention, the division of entering sunlight into equal portions is accomplished by the fly's eye lens array 220. In the example of the fly's eye lens array 220 illustrated in FIG. 2, a plurality of individual lenses 221, 222, 223, 224, and 225, are shown. For the sake of clarity, only five individual lenses 221, 222, 223, 224, and 225, are shown in FIG. 2, it being understood by those skilled in the art that a full fly's eye lens array 220 would include a square array of more individual lenses, as shown in FIG. 3. Referring to FIG. 2, the individual lenses 221, 222, 223, 224, and 225 are differently sized so each one intercepts the same amount of sunlight power. Those lenses 221, 222, 223, 224, and 225 furthest from the paraboloid parent axis, where the optical flux is highest, are the smallest. The individual lens elements 221, 222, 223, 224, and 225 are closely abutted on all sides, with only the smallest gaps between them, to minimize loss of light. Because of the focusing action of the individual lenses 221, 222, 223, 224, and 225, in the fly's eye lens array 220, the small multi-junction cells 301, 302, 303, 304 and 305, behind the individual lenses 221, 222, 223, 224, and 225, respectively, are conveniently spaced apart, simplifying electrical connections and thermal management.

FIG. 3 is a perspective view showing an example of a full fly's eye lens array 220 according to this invention, as might be matched to the pupil image of a square entering reflector 200, which image is formed by the field lens 210. In this preferred example, the individual lenses, such as individual lenses 221, 222, 223, 224 and 225, are approximately square and form part of a quilted, first surface 250, or upper surface 250.

In a preferred embodiment of this invention, the overall shape 251 of the fly's eye lens array 220 generally conforms to part of the surface of a sphere whose center is near the center of the field lens 210, and whose perimeter best coincides with the perimeter of the reflector image formed by the field lens 210. The axes of each individual lens 221, 222, 223, 224, and 225, is oriented toward the center of the field lens 210. When the generator is correctly oriented to the sun, such a configuration ensures that the rays of concentrated sunlight refracted by each and every one of the lenses 221, 222, 223, 224, and 225, of the fly's eye lens array 220, will be brought to a focus centered on that respective lens axis and on one of the PV cells 301, 302, 303, 304, and 305, respectively, in the cell array 300 behind the fly's eye lens array 220.

Figure 4:
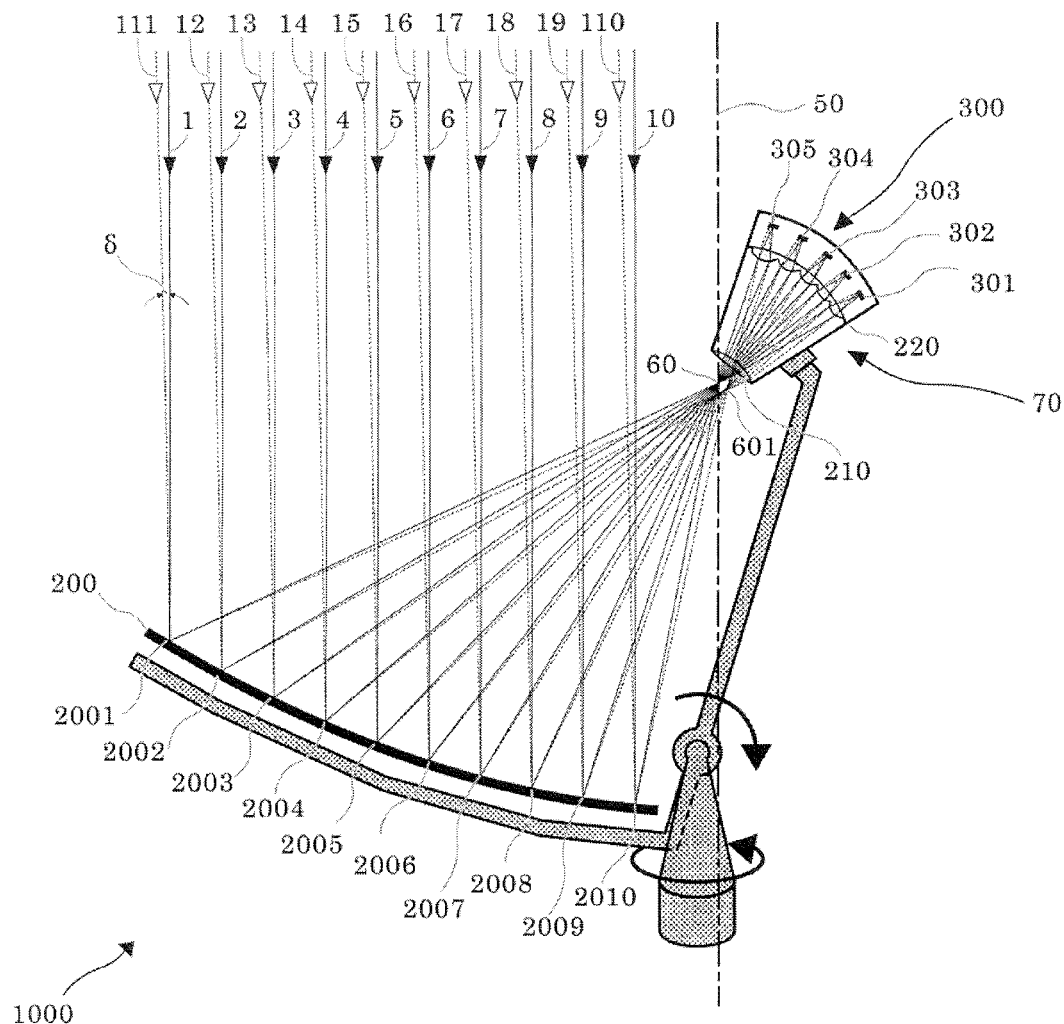
FIG. 4 is a schematic cross-section of the generator shown in FIG. 2, with the addition of off-axis rays.

FIG. 4 shows the same entering rays 1, 2, 3, 4, 5, 6, 7, 8, 9, and 10, of FIG. 2, all parallel to the optical axis 50 and reflected to the on-axis focus 60. But in addition, represented by dashed lines, FIG. 4 shows another set of rays 111, 12, 13, 14, 15, 16, 17, 18, 19, and 110, parallel to each other, but entering at a slight angle δ to the optical axis 50, as would be the case in the event of mispointing. These rays 111, 12, 13, 14, 15, 16, 17, 18, 19, and 110, are reflected from the reflector 200 at the same regularly spaced points 2001, 2002, 2003, 2004, 2005, 2006, 2007, 2008, 2009, and 2010, as the on-axis rays 1, 2, 3, 4, 5, 6, 7, 8, 9, and 10, but are brought to a displaced focus 601, which is no longer centered upon the field lens 210, but instead is offset displaced to the right of the on-axis focus 60 at point 601 as shown in FIG. 4.

Figure 5:
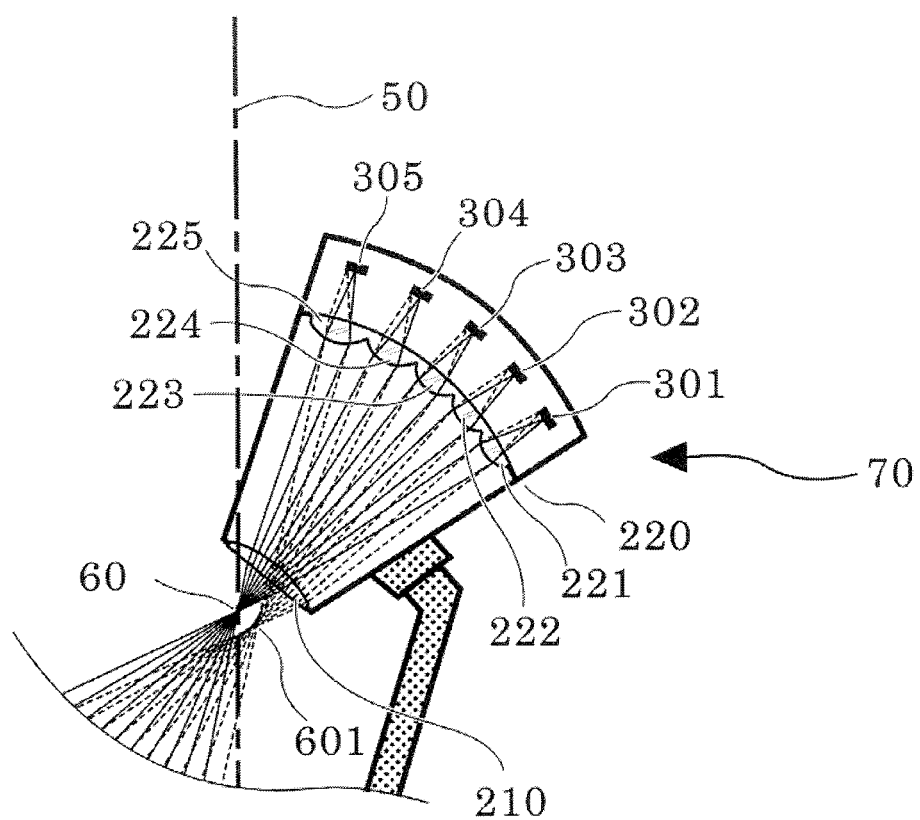
FIG. 5 shows a partial view of magnified detail of the receiver shown in FIG. 4.

FIG. 5 shows a detail of the same on-axis rays and off-axis rays of FIG. 4 as they pass through the receiver 70. We see that, after refraction by the field lens 210, off-axis rays originating at the same point on the primary reflector and passing through the displaced focus 601 end up at the same positions on the fly's eye lens array 220 as the axially aligned rays passing through the focus 60. This is because the fly's eye lens array 220 is located coincident with the concave image of the reflector formed by the field lens 210. Because both the axially aligned rays 1, 2, 3, 4, 5, 6, 7, 8, 9, and 10, and the displaced rays 111, 12, 13, 14, 15, 16, 17, 18, 19, and 110, are reflected from the same points 2001, 2002, 2003, 2004, 2005, 2006, 2007, 2008, 2009, and 2010, (shown in FIG. 4) on the primary reflector 200, and since these points 2001, 2002, 2003, 2004, 2005, 2006, 2007, 2008, 2009, and 2010, are imaged onto the fly's eye lens array 220, it follows that the on-axis rays 1, 2, 3, 4, 5, 6, 7, 8, 9, and 10, and the off-axis rays 111, 12, 13, 14, 15, 16, 17, 18, 19, and 110, come to the same points on the fly's eye lens array 220.

FIG. 5 shows also that the image of the reflector 200 formed on the fly's eye lens array 220 has a sharp, well defined perimeter. The edge of the fly's eye lens array 220 is set to coincide with this sharply defined perimeter, so that essentially all the sunlight entering the receiver 70 is captured by the fly's eye lens array 220.

An important role played by the field lens 210 in this invention is in forming a first, intermediate stage of concentration, and is illustrated by FIG. 5. Practical generating systems should tolerate pointing misalignment that may arise from gravitational flexure and wind buffeting, as well as optical manufacturing and alignment errors that displace rays from the ideal geometric design. In the present invention, the pupil image formed by the field lens 210 provides this tolerance, because equal division of first stage concentrated sunlight falling on the lenses of the fly's eye lens array 220 remains to a large degree also unchanged when the generator is mispointed slightly from the sun, thus the division of first stage concentrated sunlight is insensitive to mispointing.

The average intensity concentration factor at this first stage of concentration is equal to the ratio of the area of the reflector 200 to the area of the fly's eye lens array 220. A typical value for this first concentration might be a factor 25, though this factor can range from 10 to 100 and still fall within the scope of this invention. In detail, the concentration after the first stage is higher in regions of the pupil away from the parent axis 50, for example at the lenses 221 and 222. These lenses are made smaller, so all lenses receiver the same power. Conversely, the concentration after the first stage is lower in regions of the pupil close to the parent axis 50, for example at the lenses 224 and 225. These lenses are made larger to receive the same power.

The second stage of concentration of the sunlight onto the individual cells 301, 302, 303, 304, and 305, is accomplished by the individual lenses 221, 222, 223, 224 and 225 of the fly's eye lens array 220. These focus the already first stage-concentrated sunlight and further concentrate it onto the much smaller area of the cell 301, 302, 303, 304, and 305, respectively, behind each individual lens 221, 222, 223, 224 and 225. Referring again to FIG. 5, the fly's eye lens array 220 is shown in this example as five individual lenses 221, 222, 223, 224 and 225 focusing light onto cells 301, 302, 303, 304 and 305, respectively. The geometric intensity concentration factor for this second stage of concentration, for each of the cells 301, 302, 303, 304 and 305, is equal to the ratio of the individual lens area of the individual lenses 221, 222, 223, 224 and 225, to the cell area. A typical value for this second concentration might also be 25, though this factor might again range from 10 to 100 and still fall within the scope of this invention.

The end-to-end geometric concentration, defined as the ratio of the area of entering sunlight that is focused onto a given cell 301, 302, 303, 304 or 305, to the area of that cell, is the product of the concentrations in the first and second stages of concentration. This might typically be 25×25=625, but smaller or larger values, ranging from 100 to over 1000 could be readily achieved, and would fall within the scope of this invention.

Each PV cell 301, 302, 303, 304 and 305, is centered on the axis of the individual lens 221, 222, 223, 224 and 225, respectively, ahead of it. Thus, rays passing through individual lens 221 are concentrated and focused onto cell 301; rays passing through individual lens 222 are concentrated and focused onto cell 302; rays passing through individual lens 223 are concentrated and focused onto cell 303; rays passing through individual lens 224 are concentrated and focused onto cell 304; and rays passing through individual lens 225 are concentrated and focused onto cell 305.

Referring again to FIG. 5, it will be seen that for the case of no mispointing, the rays (shown as solid lines in FIG. 4 and FIG. 5) enter parallel to the paraboloid axis 50 and are focused at the centers of each of the cells 300, 301, 302, 303, 304, and 305. When the system is mispointed, the rays (shown as dashed lines in FIG. 4 and FIG. 5) come to a focus displaced to the left edge of the cells 300, 301, 302, 303, 304, and 305. Rays from the range of angles representing the full disc of the sun will form images of the sun centered around the focus points shown in FIG. 5.

Figure 5A:
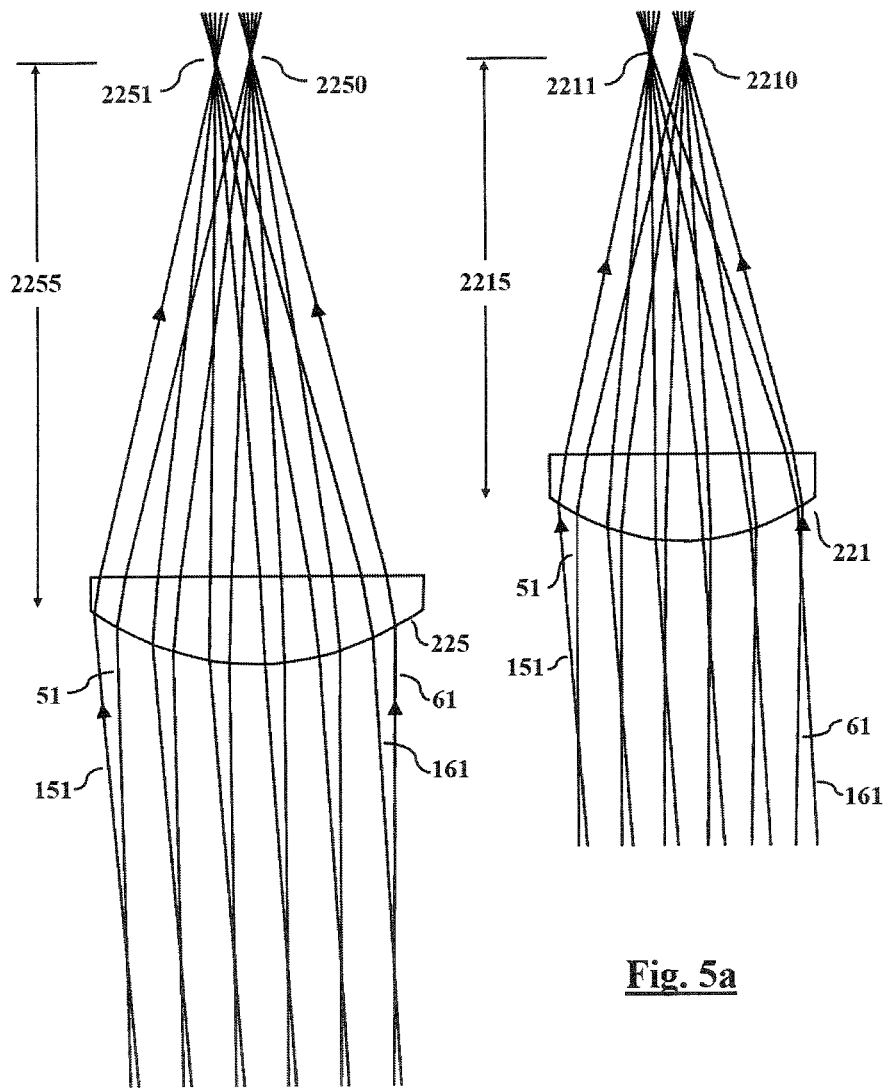
FIG. 5a is a diagram showing rays brought to a focus by differently sized elements of the fly's eye array.

FIG. 5a shows in detail how the displacement of rays at the cells for a given mispointing angle may be equalized for all cells by varying the focal lengths of the lenses of the array 220 in proportion to their size. Thus the largest lens 225, nearest the parent axis 50, is made with the longest focal length 2255, while the smallest lens 221, furthest from the parent axis 50 has the smallest focal length 2215. In this way, the distance between the on-axis focus 2250 and the mispointed ray focus 2251 of the lens 225 is made equal to the corresponding distance between the on-axis focus 2210 and the mispointed ray focus 2211 of the lens 221. Such balancing of the image scale will be made for all lenses of the array, to ensure that the entire receiver 70 has uniform response to mispointing.

Figure 6:
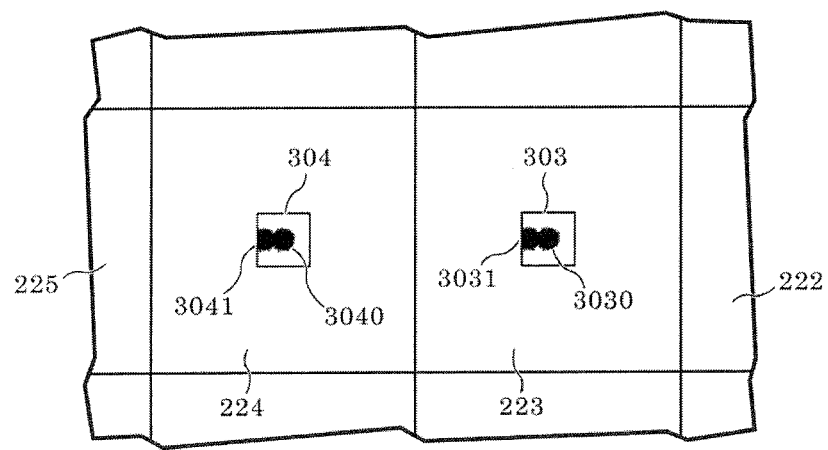
FIG. 6 is a detailed plan view illustrating the focusing of on-axis rays and off-axis rays, as seen from the field lens.

FIG. 6 shows from the viewpoint of the field lens 220 a detail of the same example of on-axis and off-axis focusing by adjacent approximately square individual lenses 223 and 224 of a fly's eye array 220. The square cells 303 and 304 are centered behind each cell's associated individual lens 223 and 224, respectively. In FIG. 6, the illumination is modeled for the full disc of the sun, and the individual lens 223 and 224, respectively, form images of the sun on each cell 303 and 304, respectively.

Referring to FIG. 6, for the on-axis case (no pointing error), the sunlight transmitted by individual lens 223 is concentrated in the solar disc image 3030 formed at the center of the cell 303. Similarly, for the on-axis case, the sunlight transmitted by individual lens 224 forms a solar image 3040 centered on the cell 304. For the off-axis case (mispointing error), the sunlight transmitted by individual lens 223 forms a displaced solar image 3031 on the cell 303, and the sunlight transmitted by individual lens 224 forms a displaced solar image 3041 on the cell 304.

As modeled here and for the example shown in FIG. 6, the square cells 303 and 304 are one fifth the size of the square individual lenses 223 and 224 used in the fly's eye lens array 220. It follows that the average second stage geometric intensity concentration factor, given by the ratio of the area of an individual lens 223 to the area of the associated cell 303, is 25 for purposes of the present invention.

FIG. 6 may be used to describe and illustrate two potential limitations that arise with the type of second stage concentration discussed so far. One is that the local intensity concentration of sunlight is much higher than the average second stage concentration, because the sunlight is concentrated in the sun's image which covers only a fraction of the area of each cell 303 or 304, which are shown as examples in FIG. 6. To handle such high local concentration, CPV cells have been made specially with widened surface conductors, but such CPV cells do not convert incident light power into electrical power with as high efficiency as other types of PV cells optimized for the lower concentration typically distributed across most of the cell area of a typical PV cell.

The second limitation is that of tolerance to mispointing. As shown in FIG. 6, the effect of mispointing is to move the concentrated light 3031 or 3041, to the edge of the cell 303 or 304, respectively. For a mispointing angle any larger than the example illustrated in FIG. 6, some concentrated sunlight will move off the cell 303 or 304 and be lost, lowering the conversion efficiency.

These limitations may be mitigated by incorporating a dome lens 233 placed in contact with each associated cell 301, 302, 303, 304, and 305. Such dome lenses 233 have sometimes been used in conventional concentrating PV systems to mitigate chromatic aberration of Fresnel lenses, (something which is much reduced in this invention), as well as to improve light distribution across a PV cell.

FIG. 7a and FIG. 7b show in a preferred embodiment a comparison in which a dome lens 233 is introduced, as shown in FIG. 7b, to increase tolerance to mispointing angle and to more uniformly illuminate an associated cell 303. FIG. 7a illustrates an example without a dome lens 233. FIG. 7a shows on-axis rays, two of which are identified with reference numerals 51 and 61, entering an individual lens 223 of the fly's eye array 220, and which on-axis rays 51 and 61 are brought to a focus 75 centered on the cell 303. In addition, two parallel rays 161 and 151 that are at a relatively large off-axis angle are brought to a focus 76 that lies above (as shown in FIG. 7a) and outside the cell 303. These off-axis rays 161 and 151 would thus generate little or no electricity in the cell 303 in the illustrated example. FIG. 7c also shows a magnified plan view of the cell 303 shown in FIG. 7a, illustrating in more detail the same central and vertically displaced foci 75 and 76.

FIG. 7b shows the same on-axis and off-axis rays refracted by the individual lens 223 of the fly's eye lens array 220 and coming to the same foci 75 and 76 as in FIG. 7a, but now with the addition of a dome lens 233 in contact with the cell 303. The lens is preferably placed with its entrance surface 2330 centered on the focus 75, and is preferably large enough to intercept also the off-axis rays, (for example rays 151 and 161), focused at 76. Now after refraction upon passing into the dome lens 233, all the rays (for example rays 51, 61, 151 and 161), both on-axis rays 51 and 61, and off-axis rays 151 and 161, fall on the cell 303. The addition of the dome lens 233 thus provides substantially greater tolerance to mispointing angle. FIG. 7d shows a magnified plan view of the photovoltaic cell 303 shown in FIG. 7b, illustrating in more detail the focus of sunlight for on-axis rays 51 and 61, and the focus of sunlight for off-axis rays 151 and 161, in the example shown in FIG. 7b illustrating the effects of mispointing with a dome lens 233. Referring to FIG. 7d, the dome lens 233 also provides more uniform illumination and eliminates the high local concentration, which is shown in FIG. 7c without the dome lens 233. Refraction by the front surface of the dome lens 233 acts to form an image of the individual lens 223 on the cell 303.

In a presently preferred embodiment, the optimum shape for each individual lens element 221, 222, 223, 224 and 225 of the fly's eye lens array 220 is square, since each of their images is then also square, and the associated image of each individual lens element 221, 222, 223, 224 and 225 will be most uniformly spread across the associated square multijunction cell 301, 302, 303, 304, and 305, respectively. It follows that the primary reflector 200 is preferably square (or rectangular), so that the corresponding approximately square (or rectangular) pupil image formed by the field lens 210 is tiled by an array of contiguous individual lenses (for example individual lenses 221, 222, 223, 224 and 225) in the fly's eye lens array 220 that individually are also approximately square (or rectangular). It follows that the exit pupils are also approximately square (or rectangular), and are readily divided into an array of approximately square individual lenses (for example individual lenses 221, 222, 223, 224 and 225) in the fly's eye array 220, that are imaged by the dome lens 233 to match the shape of the square multijunction cells (for example, the square multijunction cells 301, 302, 303, 304, and 305, respectively).

FIG. 7e shows the same on-axis and off-axis rays refracted by the individual lens 223 of the fly's eye lens array 220 and coming to the same foci 75 and 76 as shown in FIG. 7a, but now with the addition of an optical reflecting funnel 253 in optical contact with the cell 303. The funnel 253 is preferably made of glass, such as fused quartz, with the rays undergoing total reflection, and the entrance face antireflection coated. The funnel 253 is preferably placed with its entrance surface 2530 centered on the focus 75, and large enough to intercept also the off-axis rays (for example rays 151 and 161) focused at 76. The exit surface 2531 of the funnel 253 is preferably the same shape as and in optical contact with the cell 303. Now after one or more reflections on the walls 2532 of the funnel 253, all the rays, both on-axis rays 51 and 61 and off-axis rays 151 and 161, are reflected onto the cell 303. The addition of the optical funnel 253 thus provides substantially greater tolerance to mispointing angle. FIG. 7f shows a magnified plan view of the photovoltaic cell 303 shown in FIG. 7e, illustrating in more detail the rays of sunlight striking the cell 303 for on-axis rays such as 51 and 61, and off-axis rays such as 151 and 161, illustrating the effects of mispointing. The rays are scattered across the cell 303, thus the funnel 253 provides more uniform illumination of the cell 303 and eliminates the high local concentration, as compared to that shown in FIG. 7c without the funnel 253.

Figure 8A:
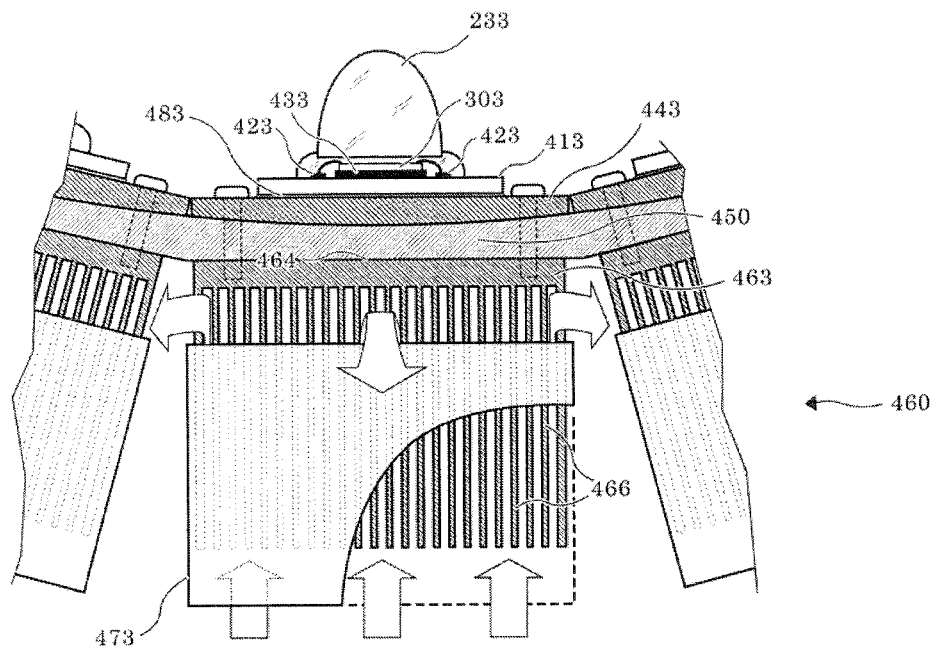
FIG. 8a shows schematically a side view of a cooled single cell with a dome lens, and illustrates how heat generated in a cell may be removed by conduction and forced convection.
Figure 8B:
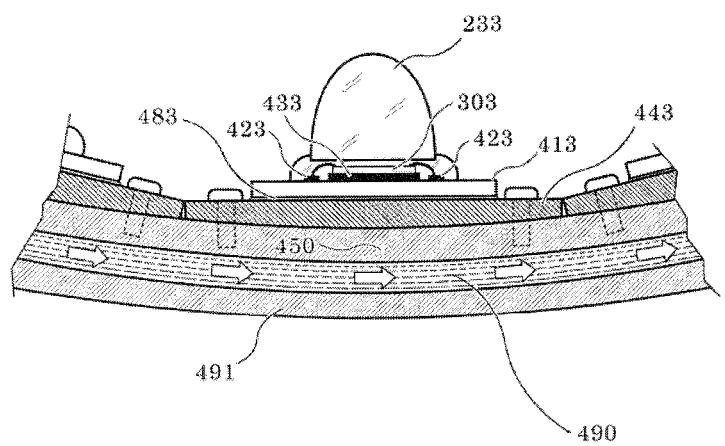
FIG. 8b shows schematically a side view of a cooled single cell with a dome lens, and illustrates an alternative method of cooling in which a thermal transfer liquid flows behind and in thermal contact with a support element.

FIG. 8a shows schematically a side cut-away view of a single cell 303 with a dome lens 233 in an example of a cooling configuration for use in an embodiment of the present invention. FIG. 8b shows schematically a side cut-away view of a single cell 303 with a dome lens 233 in a different example of a cooling configuration for use in an alternative embodiment of the present invention. The electrical connection in both configurations is made to the underside of the cell 303 is made through the copper land 433 attached to a ceramic circuit card 413. The electrical connection to the upper side of the cell 303 is made via wire bonds to the copper land 423. Terminals on lands 423 and 433 are used to connect the cell 303 to other cells (for example, cells 301, 302, 304, and 305) in the array of cells to form the electrical output of the receiver 70.

FIG. 8a shows also how in the illustrated embodiment the heat generated in a cell 303 may be removed by conduction and forced convection. Heat generated by the cell 303 is conducted through the copper land 433 and the ceramic card 413 via a thermally conducting bond 483 to a thermally conductive support 443 behind, aluminum or copper being preferred materials. In one preferred embodiment, the full array of cells 300 mounted on plates such as 443 may be supported in position behind the fly's eye lens array 220 by a concave meniscus or bowl 450. Heat may be transferred via thermal grease, gel or adhesive from the conductive cell support 443 through the bowl 450 to a heat sink 463. It should be understood by those familiar in the art that the bowl 450 will distribute heat laterally by thermal conduction, and that the finned heat sink elements 463 need not register precisely with the cells, as shown in FIG. 8a.

In the embodiment shown in FIG. 8a, the side openings of the heat sink 463 are partially blocked by sheets 473 on either side, and air is forced upward, as shown by arrows in FIG. 8a, to exit through gaps near the bowl 450. By configuring in this way for forced air convection through an array of heat sinks 460, all of the cells of the cell array 300 may be cooled. For example, if the first stage concentration of sunlight entering the fly's eye lens array 220 is 25×, and the cells 300 convert half to electricity and half to heat, the average heat density at the bowl 450 for a clear-day incoming solar flux of 1000 W/m² is approximately 12,000 W/m².

The heat sink 463 is preferably designed so that the total surface area of its fins 466 under forced air convection is approximately 20 times that of the area of the face 464 of the heat sink in thermal contact with the bowl 450. Thus the cooling at this face is 20 times greater than the typical cooling coefficient of 50 W/m²/° C. for forced convection, i.e., 1,000 W/m²/° C. For dissipation of 12,000 W/m², the heat sink fins would thus run 12° C. above ambient temperature. Taking into account the conduction thermal gradients, we can expect the temperature of the bowl 450 to run around 20° C. above ambient, which provides very good cooling.

FIG. 8b illustrates an alternative embodiment using an alternative method of cooling in which a thermal transfer liquid 490 is constrained by a sealed element 491 to flow behind and to be in intimate thermal contact with the bowl 450. In this way the heat from the cells 300, (for example cell 303 shown in FIG. 8b), may be removed and harvested as an additional form of energy from the generator. It will be understood by those familiar in the art that many forms of flow manifolds might be used to remove the heat while remaining within the scope of this invention.

Preferred Embodiments of the Receiver with High Throughput Optics

In order to realize the full potential for high overall efficiency of conversion of sunlight into electricity, in highly preferred embodiments of the invention, the refractive optical elements of the receiver 70 are optimized for maximum throughput to the cells 300, by minimizing losses by absorption and from surface reflections.

Figure 9:
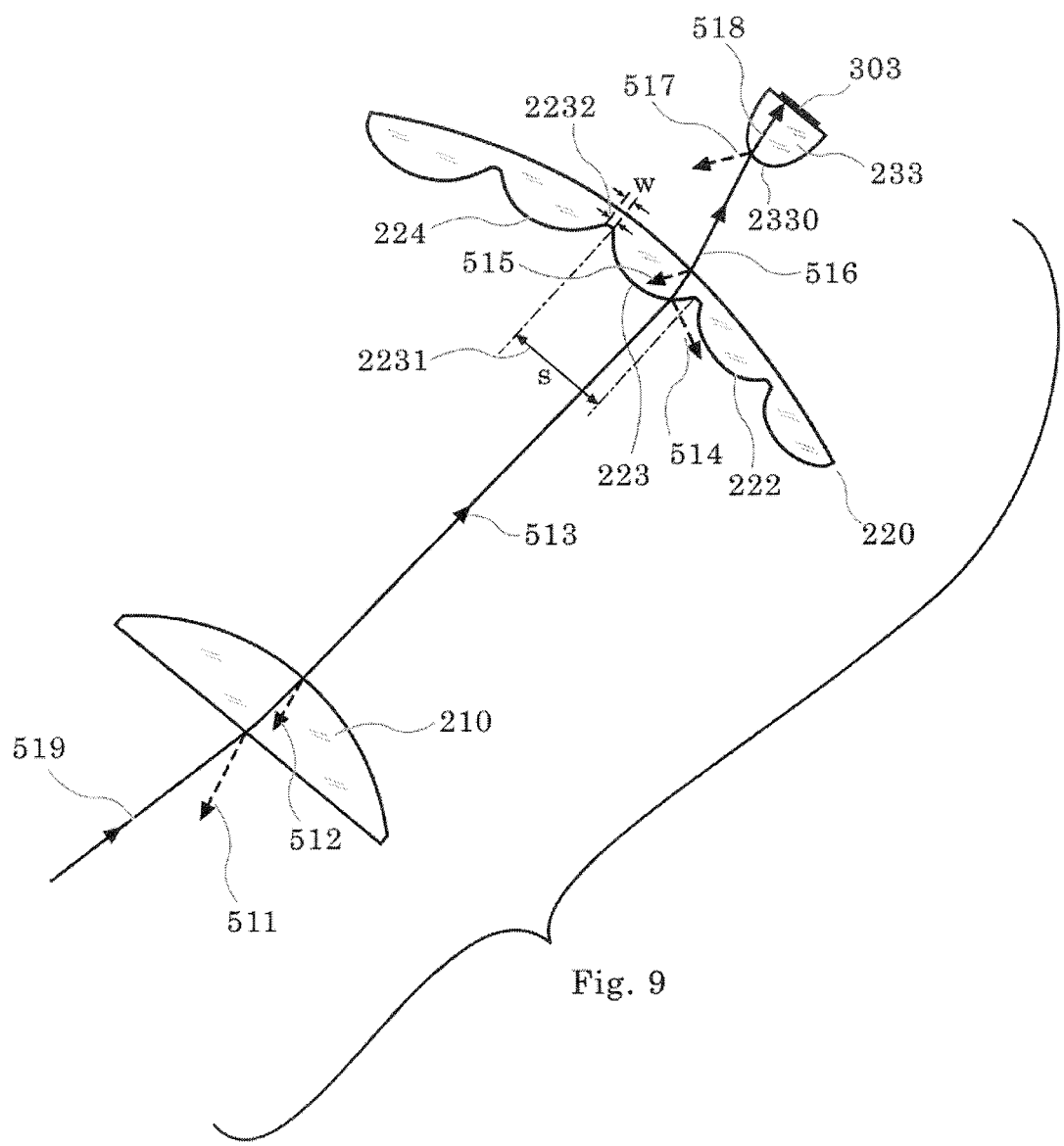
FIG. 9 illustrates light loss mechanisms in the receiver.

FIG. 9 shows schematically the reflection losses in the receiver optics, namely the field lens 210, the fly's eye lens array 220, and one of the dome lenses 233, that are addressed in these embodiments. Following the path of a typical ray 519, on entering the field lens 210, some of the power in ray 519 is lost to reflection from the entrance surface 2330, shown as ray 511. Let the fraction of power lost be $r_f$. The same fraction is lost again in the reflected ray 512 at the second surface of the lens. In addition, some light will be lost to absorption by the glass material, with a fraction $t_f$ transmitted. Thus the intensity of the ray 513 exiting from the field lens 210 will be reduced by the following factor $$t_f(1-r_f)^2.$$

Similar reflection losses take place as ray 513 transmitted by the field lens 210 passes through the fly's eye lens 223, with a fraction "$r_g$" lost to each of the surface reflected rays 514 and 515. Additional loss takes place by absorption when the transmission "$t_g$" of the lens 223 is less than 1. Finally, the ray 516 exiting the fly's eye lens 223 will lose also a fraction "$r_g$" in the ray 517 reflected at the surface of the dome lens 233. The gap between the lens 233 and the cell 303 is preferably filled with index matching optical adhesive, avoiding further surface reflection loss. The transmission of the dome lens 233 is taken to be "$t_s$." In all, accounting for all the reflection and absorption losses, the typical ray 519 that enters the cell 303 as ray 518 is reduced in intensity by the following factor $$t_f t_g t_s (1-r_f)^2 (1-r_g)^3.$$

For purposes of explanation, only one example ray 519 has been described in detail. Persons skilled in the art, having the benefit of this description, will appreciate that all rays reflected by the primary mirror 200 will suffer similar losses.

An additional loss of light received by the cells 300 takes place at the quilted entry surface 250 of the fly's eye lens array 220 if the boundaries between the individual lenses (for example individual lenses 221, 222, 223, 224 and 225) are imperfectly formed. FIG. 9 illustrates this loss in the boundary region 2232 between individual lenses 223 and 222 which is imperfectly formed; and over width "w" the boundary region 2232 does not direct entering rays to either of cell 303, or adjacent cell 302 (not shown in FIG. 9). The correctly formed region 2231 of the individual lens 223 has width "s". With these dimensions, the added fractional loss due to scattering at the edges of the individual lenses is 2w/s, and the total receiver throughput "T", taking into account losses from surface reflection, glass absorption and edge scattering, is:

$$T=(1-2w/s) \times t_f t_1 t_2 \times (1-r_f)^2 (1-r_1)^3,$$

(edge loss×total transmission loss×total reflection loss).

While each component loss may be small, if not addressed they may together combine to an unacceptable total. For example, if each glass surface were uncoated, the reflection loss would be approximately 3.5%, i.e., r=0.035. The total reflection loss would then be ~16%. If an additional 3% of the power were lost by absorption in each individual lens, i.e., t=0.97 for each individual lens, the total transmission loss will be 9%. To estimate the losses from imperfect formation of the fly's eye lens array 220, we take as an example the case where loss between individual lenses of side length s=25 mm is over width w=0.5 mm; then edge loss will be 4%. Taking these reflection, transmission and edge losses all together, the total transmission "T" of the receiver would be an undesirably low 73%. Thus preferred embodiments of the present invention include features to minimize all three types of loss, as described more fully below.

In considering the requirements for minimizing transmission and surface reflection losses, it is important that these losses be low across the wide spectrum of solar radiation that is utilized by multijunction cells 300. To reach their full conversion efficiency, the full range of this spectrum should be transmitted free of significant loss.

To minimize transmission loss in the field lens 210, it is made preferably of fused silica. This material is preferred because it has negligible absorption (<0.1% through 10 cm thickness across the solar spectrum (400-1600 nm wavelength)). Such high transmission is important not only to avoid loss of efficiency, but also to avoid overheating of the field lens 210. Thus for example, if the primary reflector 200 were to have area 10 m², the sunlight power passing through the field lens 210 would be as high as 10 kW, and 0.1% absorption would heat the lens 210 with 10 W of power. From this amount of absorbed heat, there would be essentially no risk of thermal fracture, because fused silica has the additional advantage of very low thermal expansion.

To minimize surface reflection loss over the full bandwidth of the solar spectrum, in preferred embodiments of the invention, the fused silica field lens 210 is given an antireflection coating. Here we disclose an advanced coating process with double sol-gel layers that results in very low reflection loss over the very wide spectral bandwidth of multijunction PV cells 300.

The layers applied to both sides of the silica lens 210 consist solely of porous silica, with each layer having a different degree of porosity to differentiate the refractive indices. The two coating materials were selected to yield a bottom layer refractive index of 1.33-1.40 and a top layer refractive index of 1.17-1.25. The thicknesses of each layer were optimized for the entire solar spectrum range (400 nm-1800 nm). In the past, double layer porous silica coatings have been applied to fused silica for high powered lasers (Sun, Yingying "SiO2-ORMOSIL Double-layered broadband antireflective coating for high powered lasers", 2016), and PV glass (Liping, Zou "An Abrasion Resistant and Broadband Antireflective Silica Coating by Block Polymer Assisted Sol-Gel Method", 2013).

The method described here differs in the thicknesses and indices of the two porous layers, which are tailored for broad band antireflection across two full octaves of the solar spectrum (400-1600 nm wavelength) rather than two specific wavelengths of Sun, Yingying (532 and 1064 nm). Also, the process disclosed herein using spin coating and very high temperature firings is designed specifically to produce very robust coatings that will stand up to many years of exposure outdoors.

Figure 10A:
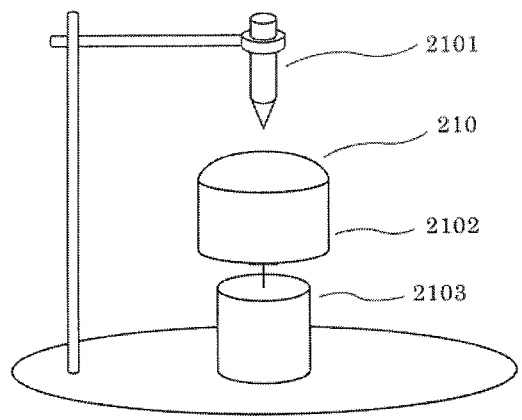
FIG. 10a shows an apparatus for coating a fused silica lens.

FIG. 10a shows schematically a spin coating apparatus designed to fit the geometry of the field lens 210. The sol is dispensed onto the lens 210 by the syringe 2101. The lens is carried by the spinning bowl 2102, driven by the motor 2103. The two layers are applied in separate steps and are derived from two different solutions of suspended silica particles yielding different microstructures of silica upon deposition. The concentrations of these solutions are between 1-5%. Depending on the concentration, the spin rates used for deposition will be between 500-1500 RPM. Each layer is fired separately at a high temperature in order to consolidate into a very robust layer. The firing temperatures lie in the temperature range 500-900 C maintained over 1-3 hours.

Figure 10B:
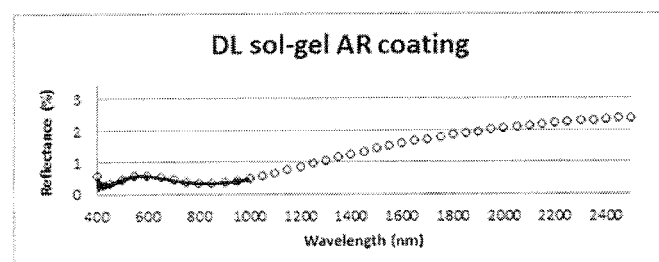
FIG. 10b shows the measured reflectivity of a coated fused silica surface.

FIG. 10b shows the measured reflectivity of a coating on fused silica obtained according to the antireflective coating process disclosed herein. The solid line shows the measured reflectivity of a single surface; where the measurement shown in FIG. 10 b was made from 400 nm wavelength to about 1000 nm wavelength. The small circles show the calculated reflectivity, which was calculated beyond the range that was measured, and was calculated out to 1600 nm wavelength.

In preferred embodiments of this invention, the additional lenses within the receiver, namely the fly's eye lens array 220 and the dome lenses 233, have aspheric surfaces, and made preferably at low cost from molded or hot-pressed glass. In a preferred embodiment, this glass is a low-expansion type, such as low-expansion borosilicate glass, to provide tolerance to thermal stress. Hot pressed lenses of such glass are made by industry in high volume, for high power illumination systems for example. For application in this invention, low-expansion borosilicate glass has a major advantage, in that it may be given an antireflection surface treatment with extremely low reflectivity over a very broad spectral range by a thermal and chemical process, as disclosed herein, in a simple, inexpensive process.

The process involves heat treating the molded borosilicate lens at temperatures between 570-650° C. for 6-24 hours to induce phase separation in which a silica rich phase and an alkali-borate rich phase is formed in equilibrium with one another. The lens is then placed into an etch bath consisting of 5-15% solution of ammonium bifluoride for 10-60 minutes to remove the skin layer formed during hot pressed molding, which tends to be silica rich, and to expose the phase separated material beneath. The lens is then leached with a mineral acid at 20-25% concentration for 5-20 minutes. Usable acids include sulfuric, nitric, phosphoric, and fluorosilicic.

Figure 11:
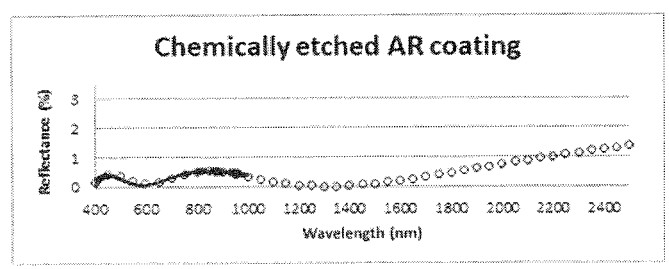
FIG. 11 shows the measured reflectivity of a treated borosilicate glass surface.

FIG. 11 shows the exceptionally low reflectivity over very wide spectral range realized by this process. The glass treated here was a 200-micron thick MEMpax borosilicate cover slide, which was heat treated at 600° C. for 24 hours. The glass was then leached in a 10% solution of ammonium bifluoride for 15 minutes, followed by a 10 minute leach at 45° C. in a solution containing 25% fluorosilicic acid, 1.5% ammonium bifluoride, and the balance distilled water.

A suitable process of phase separation and leaching for reducing surface reflectivity is described by (Pettit, Richard. "Antireflection Pyrex Envelopes for Parabolic Solar Collectors", 1983) and (Haggerty, John S. "MIT Energy Laboratory Report No. MIT-EL 82-016", 1982). The process disclosed herein is distinct in its application to press molded lenses of glass with very low absorption and unusual geometry. This process was originally designed for use with Corning 7740 Pyrex. MIT Energy Laboratory Report No. MIT-EL 82-016 explored the use of a soda-lime glass with an 80/10/10 composition of $SiO_2/Na_2O/CaO$ for use with float glass. Different compositions of glass will require different heat treatment schedules to achieve the desired spinodal microstructure of phase separation.

The composition of glass for the lenses of this invention will preferably have very low iron content, lower than found in commercially available borosilicate glasses. Typical borosilicate glasses are made for very high transmission in visible wavelengths of light, but for the present invention, typical borosilicate glasses have significant iron absorption at longer wavelengths in the near infrared, where solar emission is still strong, and that is a drawback for the present invention.

Figure 12:
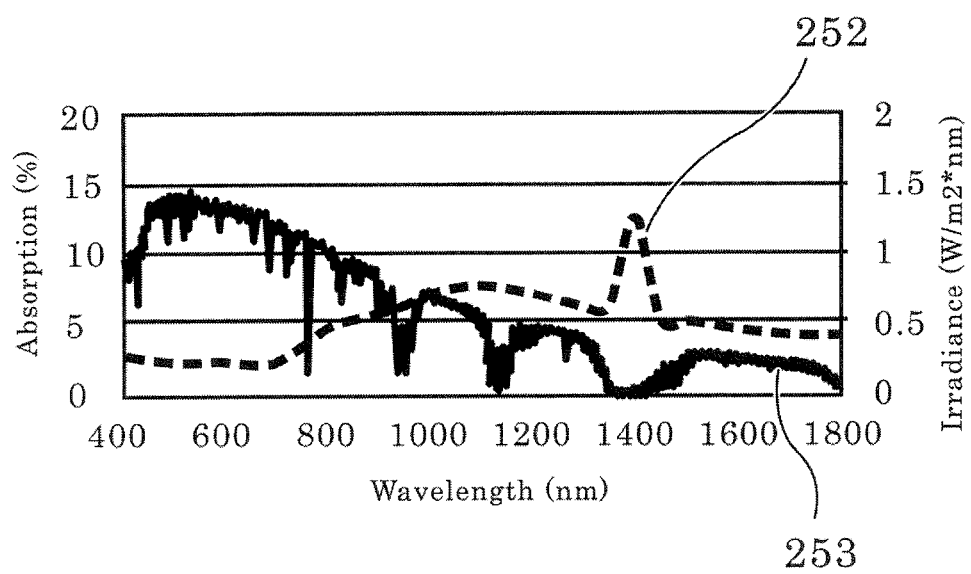
FIG. 12 shows the spectral absorption of light by a plate 19 mm thick plate of commercial borosilicate glass.

FIG. 12 shows the spectral energy distribution of sunlight (standard spectrum AM 1.5 shown by line 253) as a function of wavelength up to 2000 nm, together with the fractional absorption of light, (1-t), on passage through 19 mm thick borosilicate glass of a widely used commercial type (Schott Borofloat) (shown by line 252). 19 mm thickness is representative of the combined thickness of the fly's eye lenses 220 and the dome lenses 233 of preferred embodiments of this invention, and thus of the absorption loss we could expect if both the fly's eye lens array 220 and the dome lens 233 were made of borosilicate glass of this composition. The absorption line 252 shows the percentage absorption as a function of wavelength of the sunlight for the specified borosilicate glass. The line 253 shows the energy distribution of sunlight as a function of wavelength of the sunlight, representing a standard AM 1.5 spectrum.

The absorption averages around 5% across the solar spectrum from 400 to 2000 nm wavelength, with a broad peak of around 8% at around 1100 nm wavelength. This peak is due to a ferrous iron impurity of around 200 ppm. For this invention, in which the sunlight in converted into electricity by multijunction PV cells 300, absorption of wavelengths between around 950 nm and 1600 nm, which fall into a single junction, may cause a proportional drop in the power output of the cell 303, i.e., around 6%. For the molded borosilicate fly's eye lens array 220 and the dome lens 233 of this invention, the absorption would preferably be an order of magnitude less, with the ferrous iron content ideally less than or around 20 ppm.

Methods of Manufacture of the Fly's Eye Lens Array

In preferred embodiments of this invention, the fly's eye lens array 220 may contain a large number of individual lens elements. The representative array illustrated in FIG. 3 might be used in a 1 kW receiver as the second stage of concentration powering a 12×12 array of multijunction cells 300. As indicated, a preferred material for the fly's eye lens array 220 is low-expansion borosilicate glass, molded or hot pressed to form the aspheric surfaces of each lens element of the array 220, but the methods of manufacture are applicable to other glasses with other advantages, such as lower molding temperature.

As discussed above, preferred methods of manufacture of the fly's eye lens array 220 will minimize the loss of light due to any imperfections in the formation of the quilted entry surface 250 of the lens array 220. Here we disclose alternative methods of manufacture aimed at reducing such loss to less than 1%, i.e., w/s<$1/200$. In method 1 lenses are first individually molded, typically round, to the required focal length(s), then cut to form the different size and approximately square individual lens elements to be mechanically assembled together into the fly's eye lens array 220. In method 2, a plurality of elements are molded in one step either as a complete fly's eye lens array 220 in a single piece, or as sub-arrays to be fitted with other sub-arrays to form the complete fly's eye lens array 220.

Method 1—Mosaic Assembly

Figures 13A, 13B:
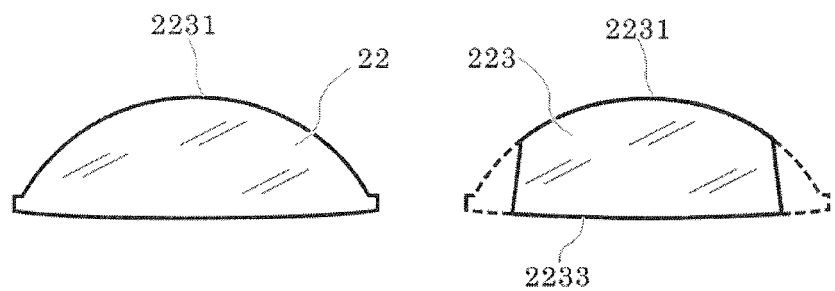
FIG. 13a shows a lens with a convex aspheric upper surface.
FIG. 13b shows the single lens illustrated in FIG. 13a, which has been cut to the correct shape to fit as an element of the fly's eye lens array.

FIG. 13a shows a lens 22 with convex aspheric upper surface 2231. A plurality of lenses 22 are press-molded and subsequently phase separated by holding at appropriate temperature, as described above. FIG. 13b shows a single lens 223 made by cutting a lens 22 to the correct shape to fit as an element of the fly's eye lens array 220. The cut sides are preferably angled as shown, so a plurality of lens segments 223 will fit closely together to form the fly's eye lens array 220. The individual press-molded lenses are cut accurately into the individual, differently-shaped segments needed to form said array with minimal gaps.

Referring to FIG. 9, in order to minimize the boundary region 2232, the cut made on the molded aspheric side 2231 of the lens must be accurate and clean to the edges. A preferred method of cutting is by water jet. In a preferred procedure, the water jet enters on the lower side 2233 shown in FIG. 13b and exits the more curved side 2231, to eliminate surface roughness on the edges of the cut due to spreading of the water jet before impact. Such roughness on the side 2233 of the lens 223 is not a problem, because on entering the lens 223, the light is refracted away from the cut edge, as shown in FIG. 7. In another preferred method, the lenses may be cut using a diamond saw.

To build up sub-arrays or the full fly's eye lens array 220, the cut sides of the mosaic lens elements 223 may be glued together. Preferably, the glue is wicked in from the side 2233 shown in FIG. 13b, so as to avoid an accumulation forming a boundary region 2232 (as illustrated in FIG. 9) from the glue itself.

Figure 13C:
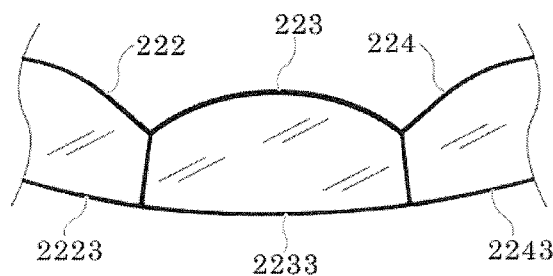
FIG. 13c shows a portion of the fly's eye lens array which is made by fitting together a plurality of cut lenses that were cut as shown in FIG. 13b.

Referring to FIG. 13c, as an alternative or in addition to side gluing, the individual lens elements 223 may held in position to form the full fly's eye lens array 220 by optical bonding the faces 2223, 2233 and 2243 to a faceted glass bowl. In this method, the leaching process to produce the antireflection property is preferably carried out after the subarrays or full fly's eye lens array 220 is assembled, to minimize handling that could damage the coated lens surfaces 2231.

Figure 13D:
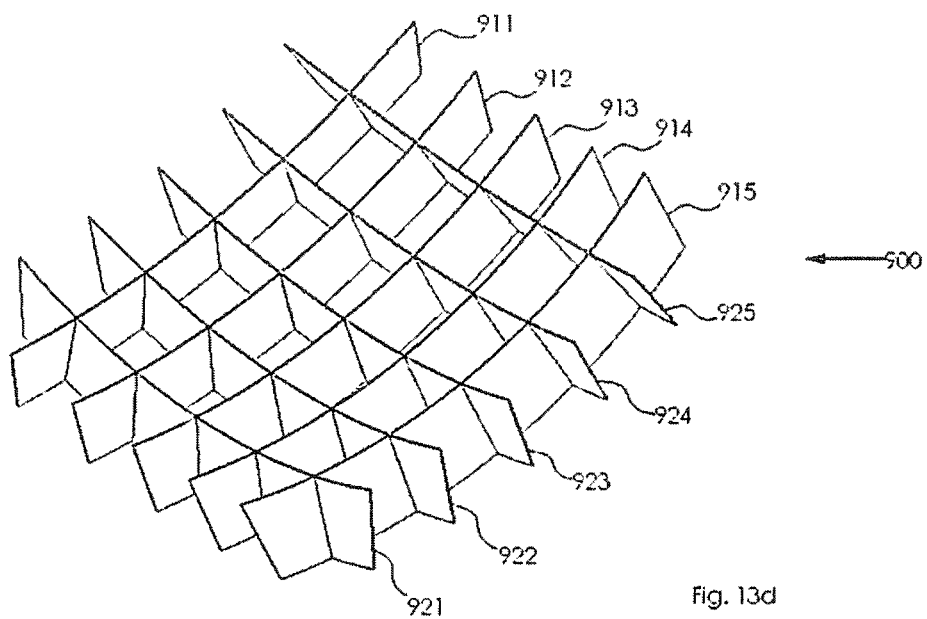
FIG. 13d is a schematic diagram of the supporting structure for a fly's eye array.
Figure 13E:
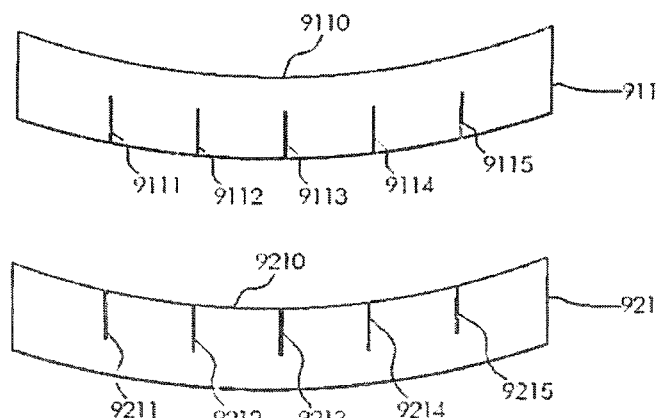
FIG. 13e shows slotted arcs for assembly into a slotted egg crate structure.
Figure 13F:
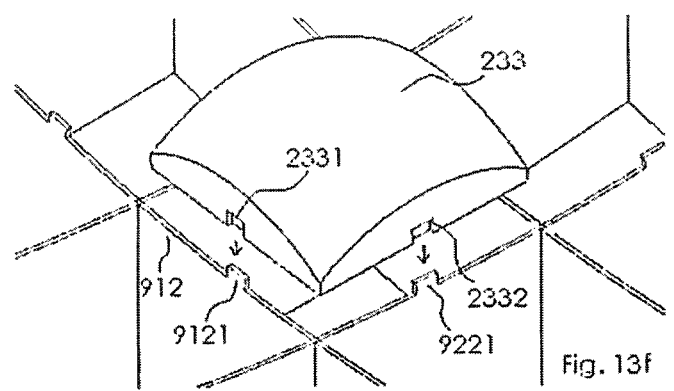
FIG. 13f shows a detail of matching slots and tabs for lens positioning.

Referring to FIG. 13d, FIG. 13e and FIG. 13f, the full fly's eye lens array 220 may be assembled alternatively from the cut lens elements by bonding them individually to an underlying supporting structure, constructed with openings so as to avoid light blocking. FIG. 13d shows schematically such a supporting structure 900 made in the style of a slotted egg crate. Component elements are slotted arcs, as shown in FIG. 13e, made for example from laser-cut aluminum sheet. Arc 911 has cut into it the five slots 9111, 9112, 9113, 9114 and 9115, while arc 921 has slots 9211, 9212, 9213, 9214 and 9215. The slots are parallel to each other. In FIG. 13d, the five slotted arcs 911, 912, 913, 914 and 915 slot over the five arcs 921, 922, 923, 924 and 925, making a structure to carry 36 individual lenses in a 6×6 array. It should be understood that FIG. 13d is a schematic diagram, and the number and shape of the arcs will be chosen to match the desired fly's eye array. In general, the arc shapes and slot positions will be different for every arc, so that every cell of the structure 900 matches precisely the dimensions of the fly's eye lens array.

Figure 13G:
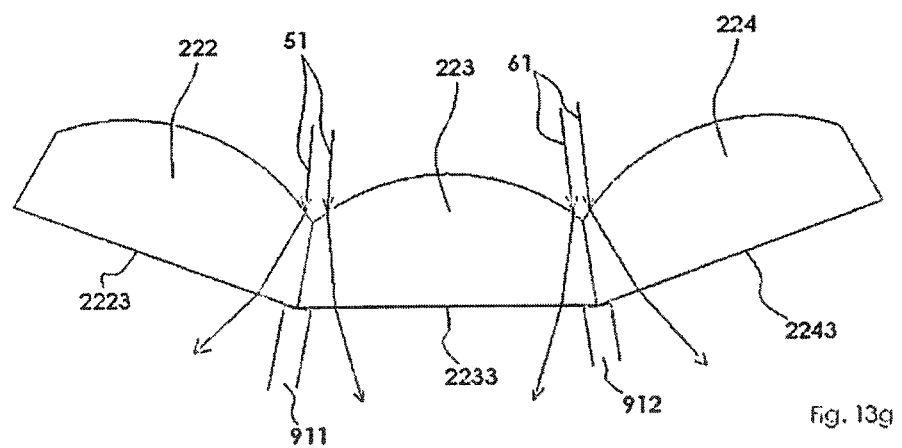
FIG. 13g is a ray diagram showing how refracted rays are not blocked by the support structure.

The upper surfaces of all the arcs, such as 9110 and 9210 in FIG. 13e, in the full assembly 900 will be constructed so that they define the desired shape of the fly's eye lens array. Each cell is the size needed to match the size of the lens to be attached. Referring to FIG. 13f, the upper surfaces of the arcs 912 and 922, here shown in detail, may be provided with locating tabs such as 9121 and 9221, and the lenses with slots such as 2331 and 2332, sized and positioned to ensure accurate registration of each lens 233 to its cell 303. Thus slot 2331 in lens 233 engages with slot 9121, and slot 2332 engages with tab 9221. The slotted arcs 911 and 921 will preferably be made thin enough so as to not block light refracted by the lens elements to the multiple foci. FIG. 13g illustrates how incoming rays 51 and 61, upon refraction at the upper surfaces of the lenses 222, 223 and 234, are refracted toward the lens focus and away from the arc segments 912 and 922, and are not blocked by the arcs 911 and 912 of the supporting structure.

Method 2—Molded Array

In an alternative molded array method, the entry surfaces of a plurality of adjacent elements of the fly's eye lens array 220 are formed together by hot-pressing glass against a quilted mold. Those familiar with the art will appreciate that while hot pressing is a well-established process for forming complex decorative patterns in glass bowls, for example with the appearance of cut glass, the very sharply defined boundaries desirable in accordance with the present invention have not been achieved in large arrays of molded lenses.

Figure 14A:
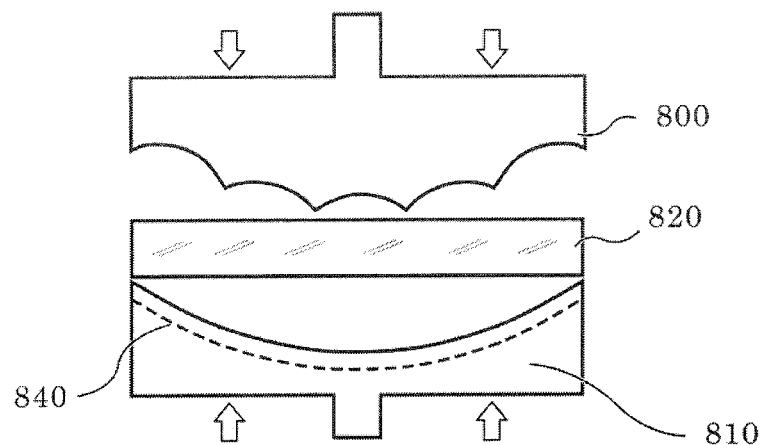
FIG. 14a is a schematic diagram illustrating a step in the manufacture of the fly's eye lens array by one-piece array molding, where the first part of the mold is quilted with the inverse shape of the desired fly's eye lens array or subarray.
Figure 14B:
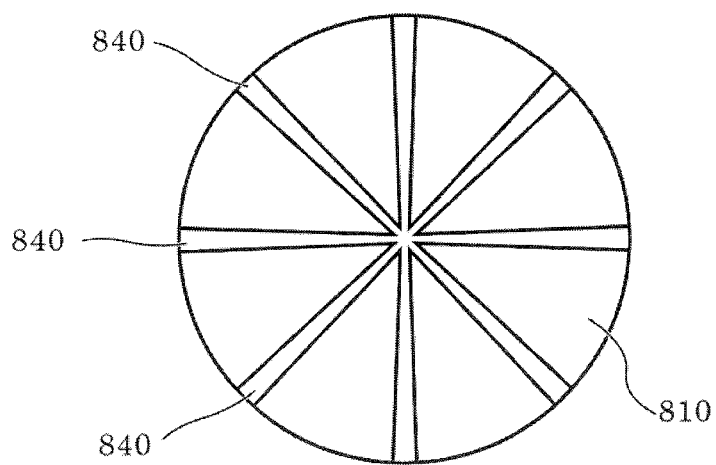
FIG. 14b is a schematic diagram illustrating a step in the manufacture of the fly's eye lens array by one-piece array molding, where the second part of the mold is concave with grooves cut radially to take the squeezed out glass.
Figure 14C:
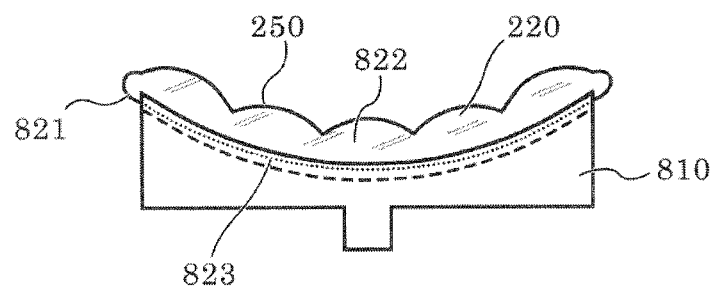
FIG. 14c is a cross-sectional view illustrating a step in the manufacture of the fly's eye lens array by one-piece array molding, where the just-formed and still relatively soft molded glass is supported by the concave second lower side of the mold.

FIG. 14a, FIG. 14b and FIG. 14c show schematic diagrams of steps in a preferred embodiment of an alternative process to realize sharp definition. Referring to FIG. 14a, the first part of the mold 800 is quilted with the inverse shape of the desired fly's eye lens array 220 or subarray, and is overall convex in shape. The second part of the mold 810 is concave with grooves 840 to take the glass squeeze-out, cut radially, as shown in FIG. 14b. The glass preform 820 may take the form of a plate of uniform thickness, as shown in FIG. 14a, or of a plurality of individual gobs. To mold the glass 820, both the first part 800 and the second part 810 of the mold, and the glass preform 820, are all first brought to the same temperature, which is the temperature needed to soften the glass 820. Pressure is then applied to form the quilted side of the glass array in an essentially isothermal process. During this process to form the first surface of the fly's eye lens array 220, excess glass 821 may be squeezed out around the perimeter of the mold 810 and also into the radial grooves 840 in the second part 810 of the mold. By holding the mold 800 and 810 and the glass 820 close to isothermal during the pressing, there is little lateral stress from differential expansion between the glass 820 and the mold 800 and 810, and thus wear on the sharp features of the mold 800 is minimized, to maximize longevity.

On completion of the formation, with the quilted first surface 250 of the glass correctly formed, the first part of the mold 800 is parted while still at the molding temperature, ready to form the next array. FIG. 14c shows the just-formed and still relatively soft molded glass 822, supported by the concave second lower side of the mold 810. In the next step, the now molded glass 822 and the second part of the mold 810 are cooled to freeze the glass 822. During this cooling, radial groves 840 may be incorporated to allow for differential expansion of the squeezed-out glass 821 with minimal wear between the support 810 and the glass 822. Once the temperature has reached that needed for phase separation, the molded glass 822 may be held at that temperature until phase separation is completed. The glass 822 so formed with the array of lenses on the first side 250 may be cut around the edges and ground and polished on the second surface 823 to remove any squeezed-out features.

Specific Designs of Two Preferred First Stage Concentrators

Figure 15A:
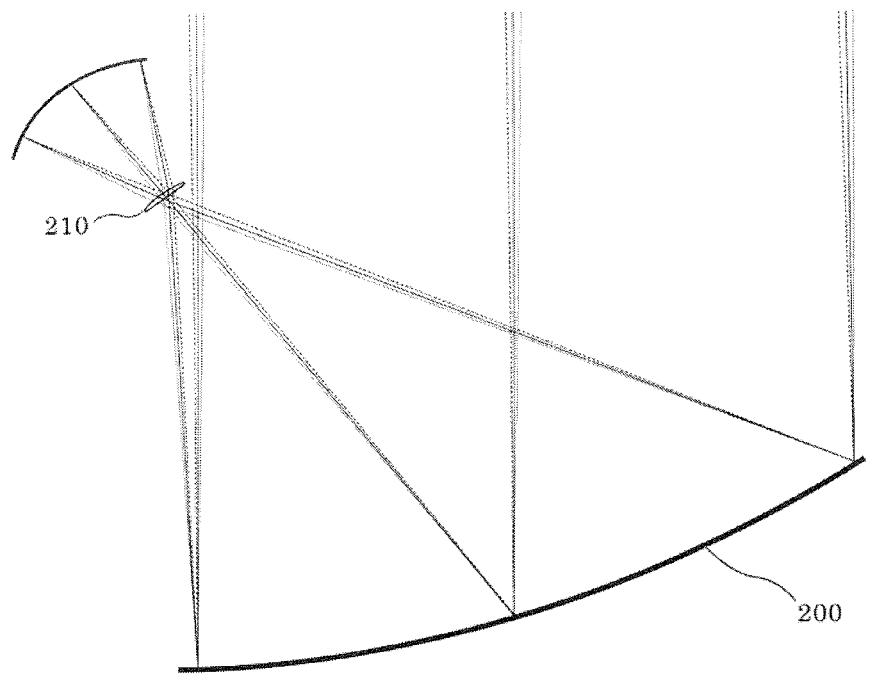
FIG. 15a shows a ray trace diagram for a specific first stage concentrator.

FIG. 15a shows a ray trace diagram for a specific preferred example design of a first stage concentrator. The prescription for this example is given in Table 1.

Figure 15B:
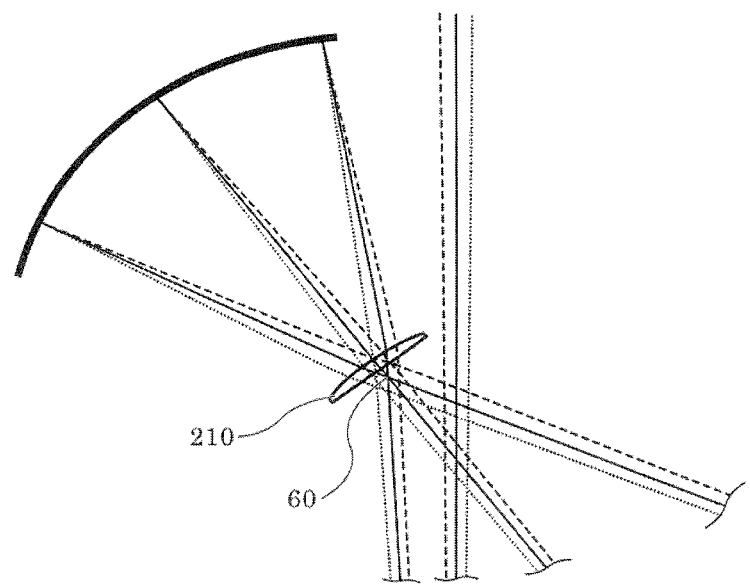

The paraboloidal mirror 200 had a 2.5 m focal length. The entrance aperture of the paraboloidal mirror 200 was square, 3.3 m×3.3 m, and was offset 1.7 m from the paraboloid axis 50. In this example, the ray trace diagram in FIG. 15a was generated as an illustrative example. The detail of FIG. 15b shows the field lens 210 which was a meniscus of fused silica positioned 50 mm beyond the paraboloid focus 60. The lens 210 formed a pupil image with radius of curvature 0.7 m.

Figure 16:
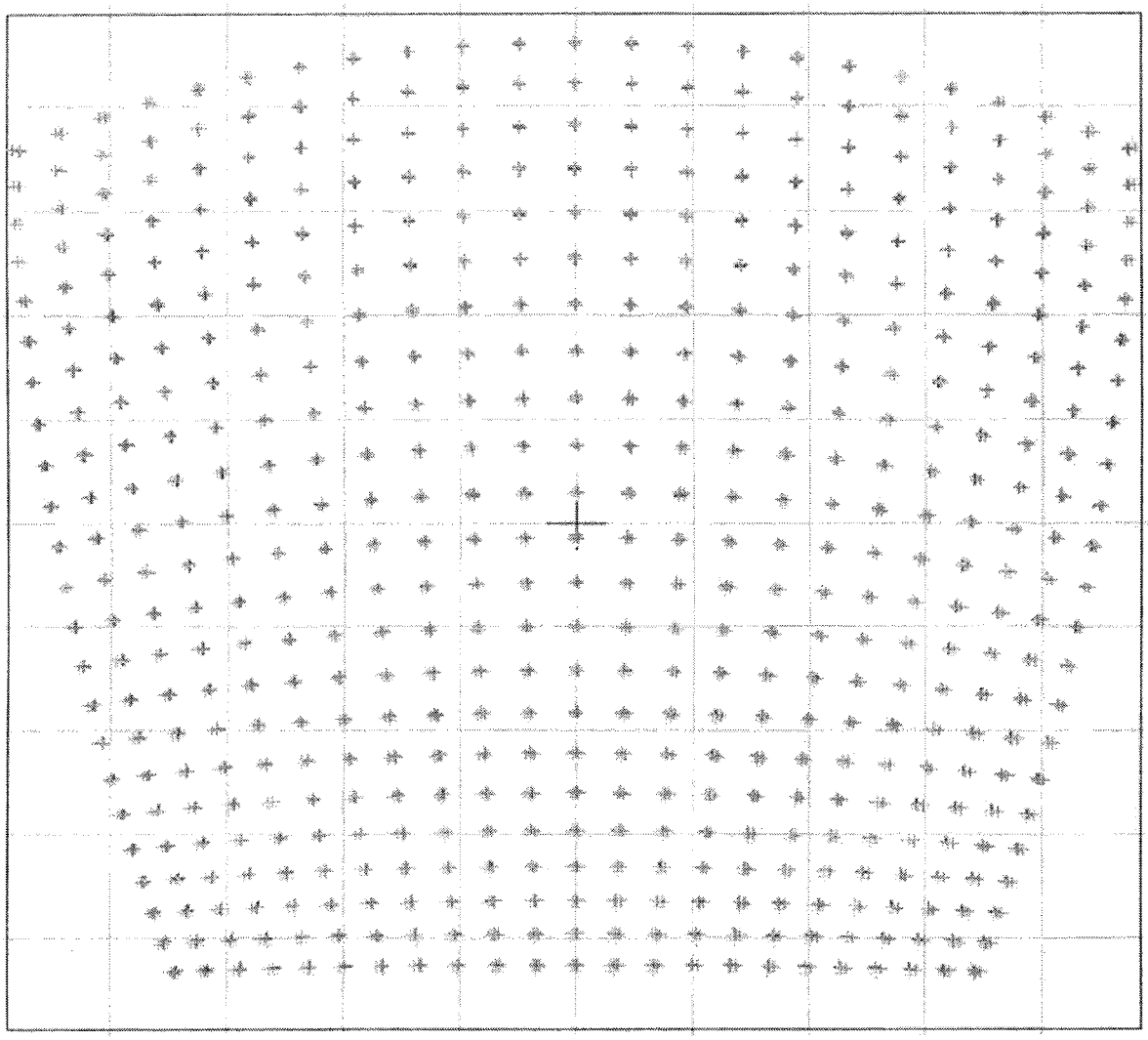
FIG. 16 shows a footprint diagram for rays at the pupil image.

For the example described in connection with FIG. 15b, a footprint plan view of the first stage concentration pupil image is shown in FIG. 16, within a 0.76 m square outline. The concentration averages 20×. The crosses depicted in FIG. 16 show the position in the pupil of five sets of parallel rays entering on a uniform grid, on-axis and ±0.5° off-axis, in both azimuth and elevation. A fly's eye lens array 220 according to this invention, whose individual lens corners coincide with the grid of points in this FIG. 16, will divide the sunlight in the pupil image into equal amounts, independent of small mispointing errors.

Figure 17A:
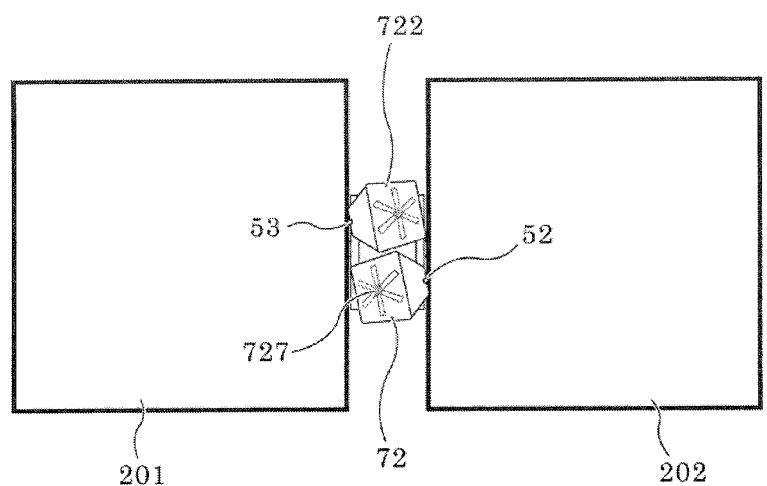
FIG. 17a shows a plan view of a generator configured with two off-axis paraboloidal reflectors and their respective fly's eye receivers.
Figure 17B:
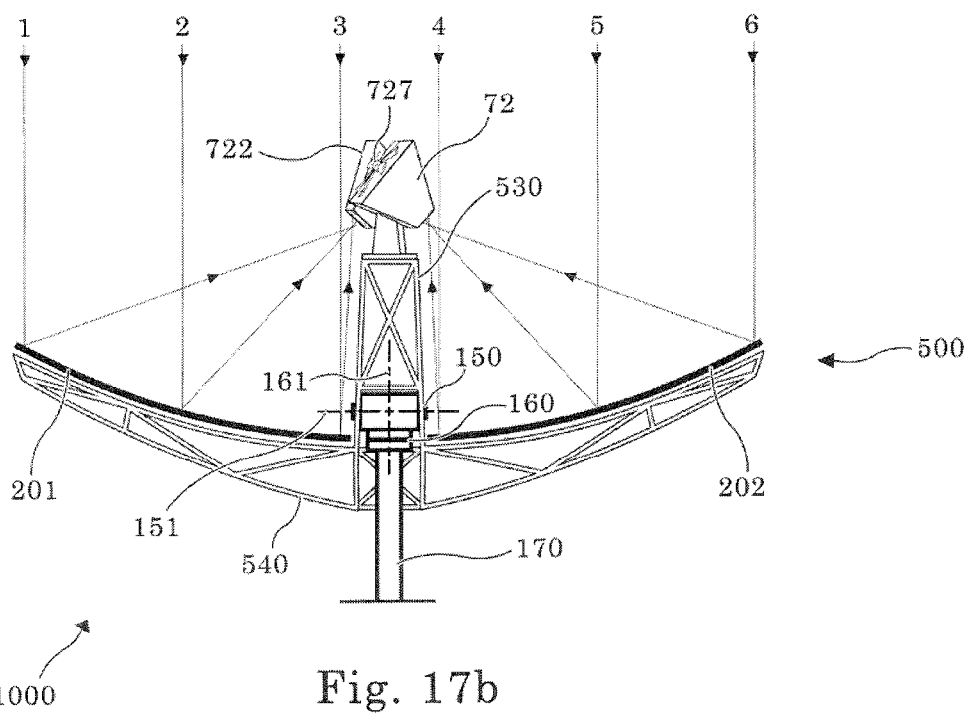

FIG. 17a and FIG. 17b show a preferred embodiment of a solar generator according to the present invention configured to be balanced about both the elevation axis 151 and azimuth axis 161. Balanced systems may be preferred because of their potential for lighter weight and lower cost tracking.

FIG. 17a shows a plan view of the generator incorporating two off-axis paraboloidal reflectors 201 and 202 and their respective fly's eye receivers 722 and 72. Their respective paraboloid axes 53 and 52 are vertical, marked as small circles. The receivers 722 and 72 are adjacent to each other and positioned between and facing to the centers of the associated reflectors 201 and 202, respectively.

FIG. 17b shows a side view of the generator 1000 illustrated in FIG. 17a. Sunlight rays 1, 2 and 3 incident of reflector 201 are focused into receiver 722; while sunlight rays 4, 5 and 6 are directed into receiver 72.

The elevation structure 500 comprises an integrated lightweight structure 540 supporting both reflectors 201 and 202 and rigidly connected to the lightweight vertical structure 530 that carries both receivers 722 and 72. The elevation bearing 150 is positioned so that its axis 151 passes through the center of gravity of the elevation structure 500. The elevation bearing 150 is supported by an azimuth bearing 160 atop a fixed post 170. As shown in FIG. 17b, the elevation structure 500 is relieved on the side in front of the post 170, so it is free to tilt downward in elevation, when the receivers 722 and 72 move out toward the viewer. Forced convective cooling of the receiver 72 is provided by an axial fan 727. A similar axial fan is provided for the receiver 722.

Figure 18:
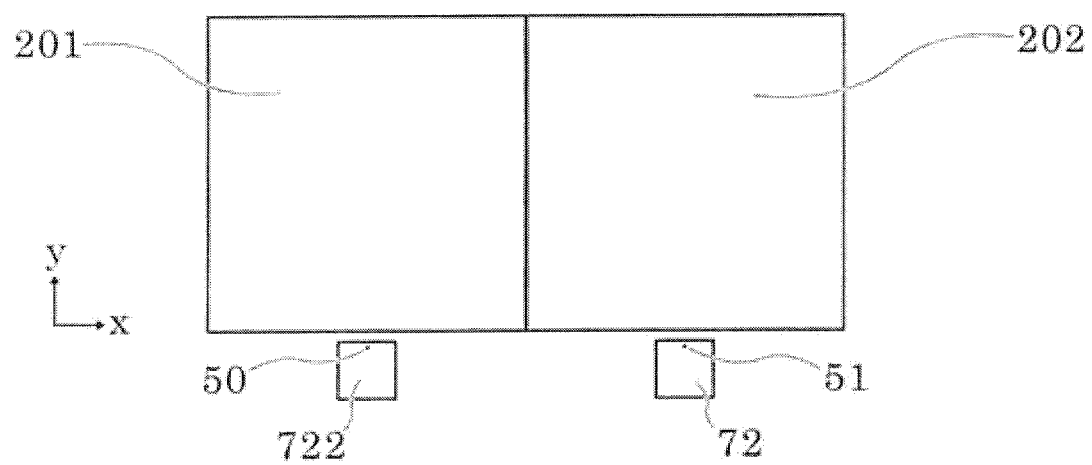
FIG. 18 is a plan view of an alternative generator with two adjacent mirrors.

FIG. 18 is a plan view of a second preferred embodiment of the invention, a generator 1000 with two adjacent large square off-axis paraboloidal reflectors 201 and 202. Sunlight rays striking the first reflector 201, are focused into a first receiver 722, where they are converted into electricity. Similarly rays striking the second reflector 202 are focused into a second receiver 72. The first and second receivers 722 and 72 are fixed in position relative to the first and second reflectors 201 and 202, respectively, by arms positioned below any incoming rays to receive all reflected rays (not shown, but similar to 531 and 532 in FIG. 1). In this preferred embodiment, the primary reflectors 201 and 202 are positioned adjacent to each other, with no significant gap. Their parent axes 50 and 51 (vertical in this plan view and therefore shown as dots) are offset in the y direction but are symmetric to each mirror in the x direction.

Figure 19:
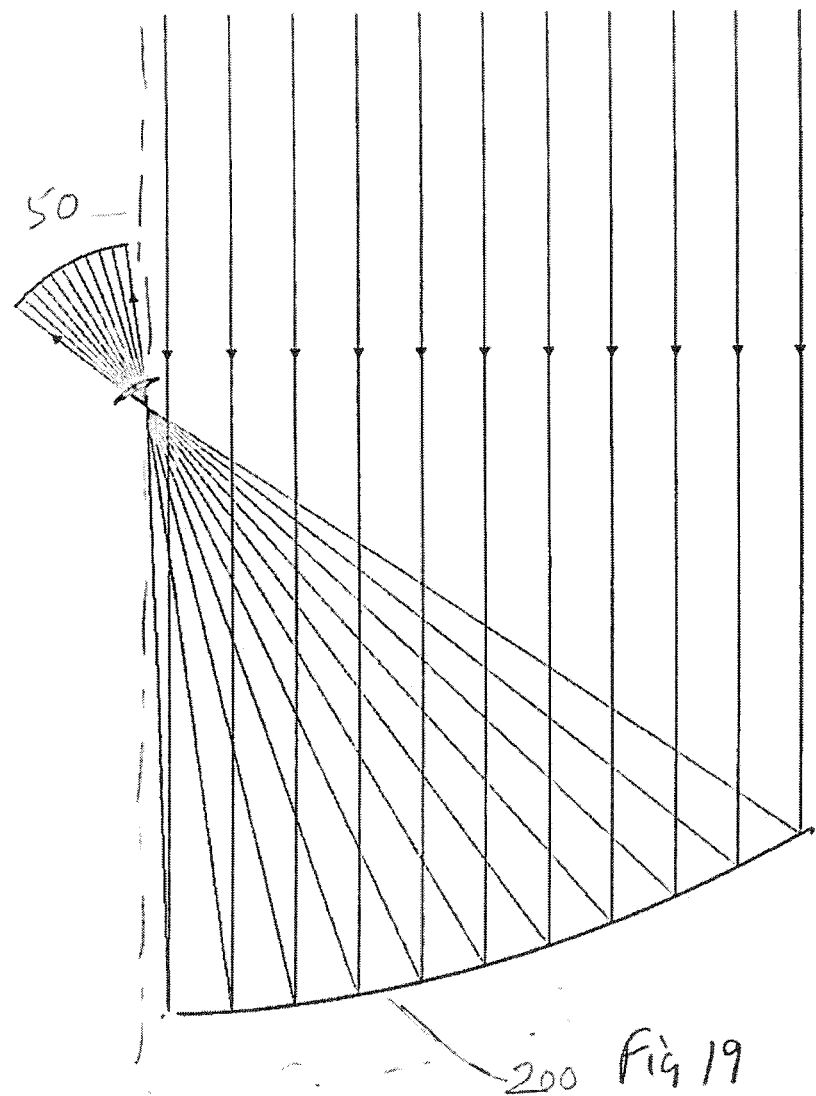
FIG. 19 shows a ray trace diagram for first stage concentrator of the alternative generator referenced in FIG. 18.
Figure 20:
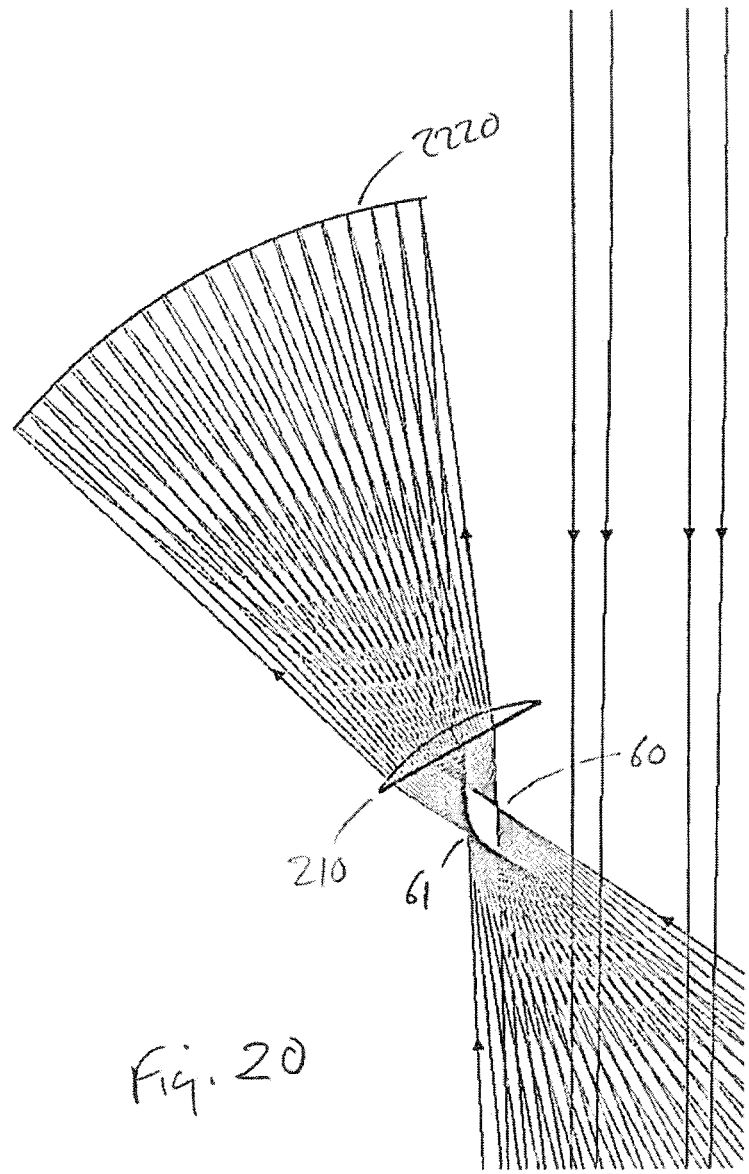
FIG. 20 shows a raytrace diagram detailing the receiver referenced in FIG. 18.

FIG. 19 shows a ray trace diagram for this second preferred embodiment, whose optical prescription is given in Table 2. In this example, the paraboloidal mirror 200 has a 3 m focal length. The entrance aperture of the paraboloidal mirror 200 is square, 3.17 m×3.15 m, and is offset 1.7 m from the paraboloid axis 50. FIG. 20 shows in more detail a ray trace of the field lens 210, a meniscus of fused silica positioned 90 mm beyond the paraboloid focus 60. The lens 210 weighs 1.52 kg and forms a pupil image on the curved surface 2220, where the fly's eye lens 220 (not shown) will be located.

Figure 21:
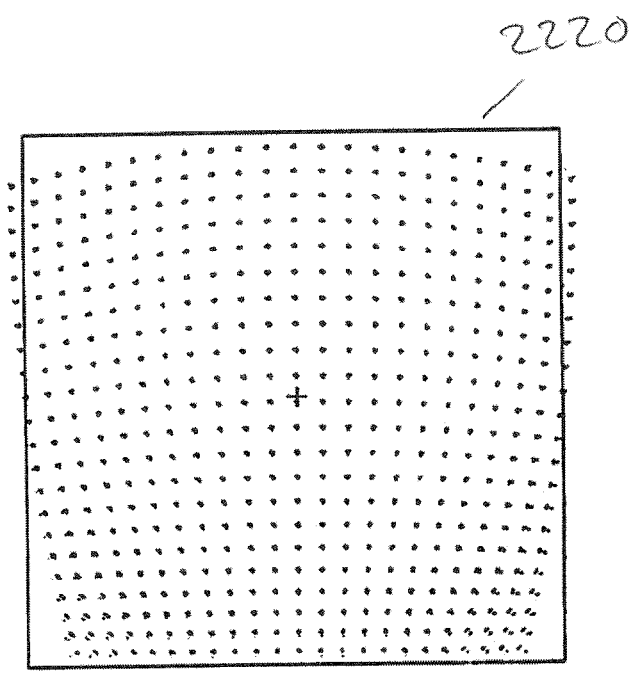
FIG. 21 shows a footprint diagram for on-axis and off-axis rays at the pupil image location of the fly's aye array.

A footprint plan view of the first stage concentration pupil image on the surface 2220 is shown in FIG. 21, with a 0.6 m square outline shown for scale. The concentration averages 28×. The point clusters depicted in FIG. 21 show how parallel rays of light in a uniform grid that enter the primary mirror 200 are brought to a focus on the surface 2220. The grid of 22×22 ray bundles shown marks the position of rays that enter the system on-axis and ±0.75° off-axis in both azimuth and elevation. A fly's eye lens 220 in a 22×22 array, according to this preferred second embodiment of the invention, placed with the corners of the individual lenses coincident with the grid points in FIG. 21, will divide the sunlight in the pupil image into a 22×22 array of equal amounts, largely independent of small mispointing errors.

Figure 22:
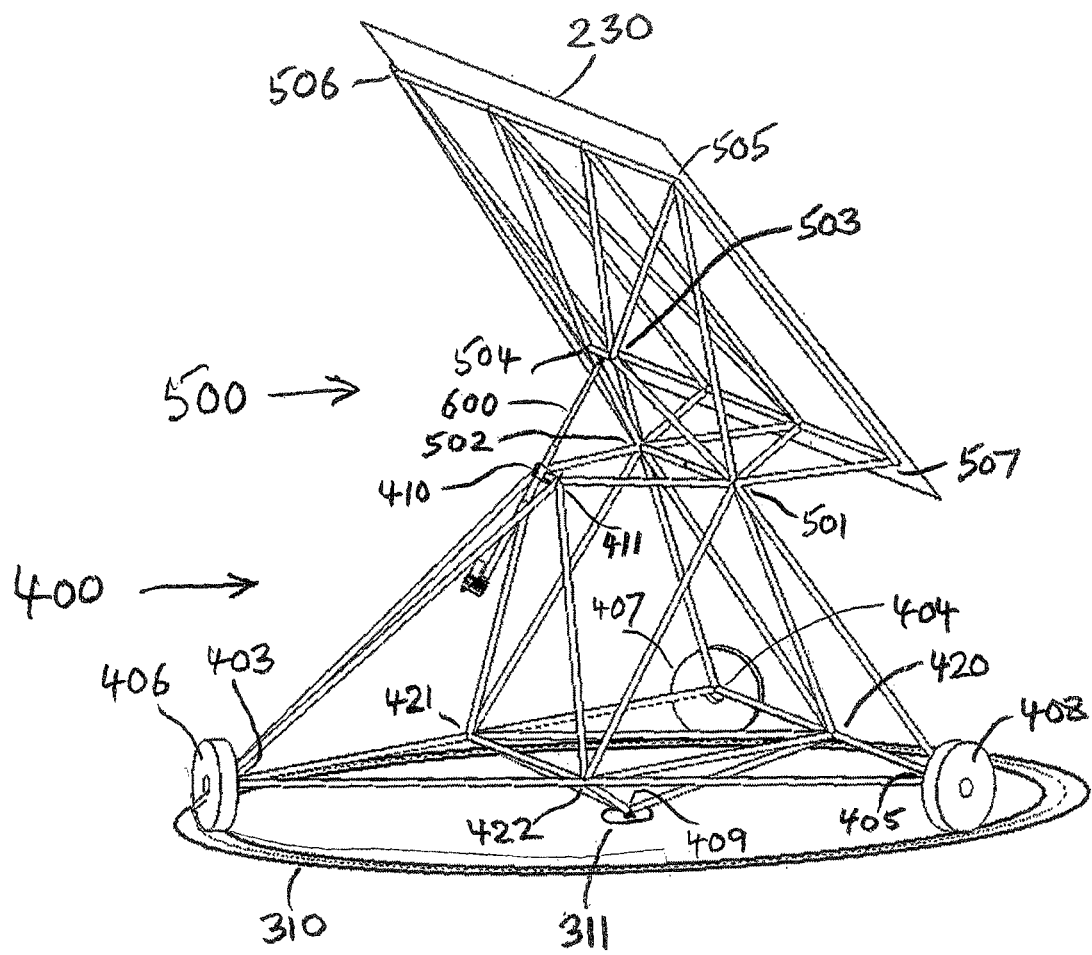
FIG. 22 shows a dual axis tracker with a flat reflector in a preferred embodiment of this invention.
Figure 23:
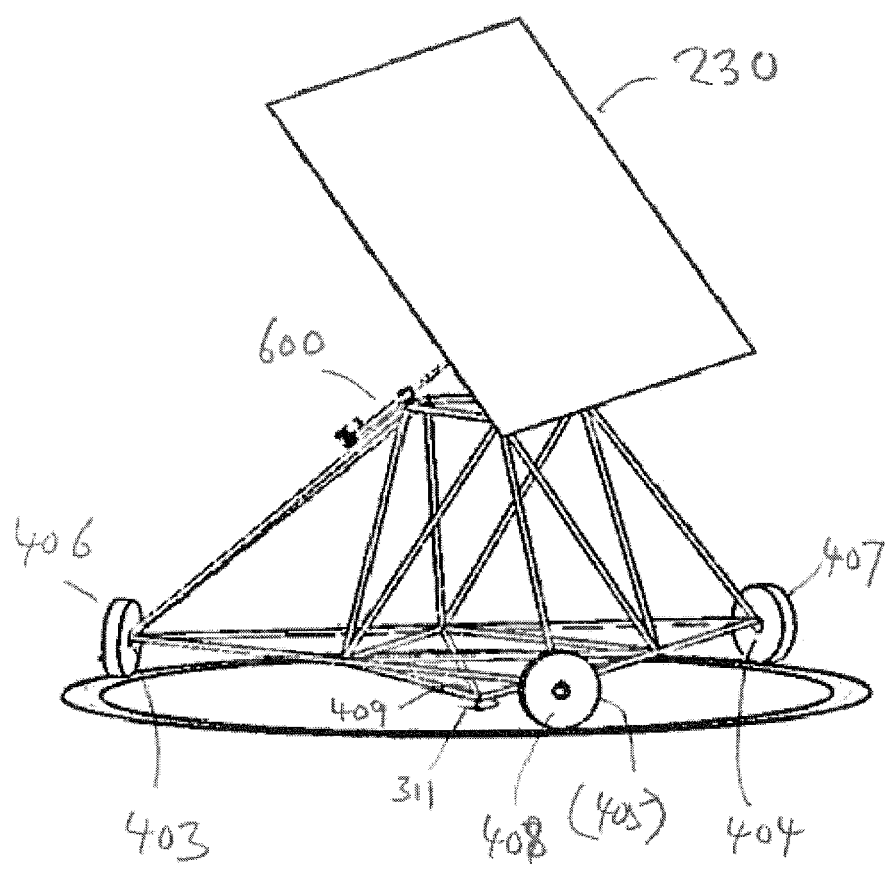
FIG. 23 shows the dual axis tracker of FIG. 22 at the same elevation but rotated about the track, to show the front of the reflector surface.

FIG. 22 and FIG. 23 show a preferred embodiment of a dual axis tracker according to this invention. The tracker is designed for use both with essentially flat reflectors as a heliostat, as shown, or with dish-shaped reflectors with fly's eye receivers, as shown below in FIG. 25. The tracker comprises a lower rigid spaceframe structure 400 that rotates on a circular ground track 310 about a lateral ground restraint 311, and an upper hinged elevation spaceframe 500 carrying solar reflectors 230 and driven about an approximately horizontal axis defined by nodes 501 and 502 by a linear actuator 600. In operation, the solar reflectors are set to their desired orientation by a combination of driving the structure 400 around the track and setting the length of the actuator 600.

The lower spaceframe 400 is supported on the track 310 by three wheels 406, 407 and 408, which are attached to nodes 403, 404 and 405 that form the base triangle of the spaceframe 400. One or more of these wheels is motorized, and used to rotate the structure 400. The center of rotation is fixed by a lateral ground anchor 311, to which is attached a central lowest node 409 of the structure 400. The coupling to the anchor 311 is such as to constrain lateral motion, so that the wheels remain on the track, but not to constrain downward motion. In this way we ensure that the rigid spaceframe 400 is not over-constrained. Of the six degrees of freedom of rigid body motion, four are controlled by the rotation of the three wheels around the track (vertical position, tip, tilt and rotation), and lateral position (x and y) by the center ground anchor. Irregularities in the ground track will result in the "elevation" axis of rotation 501-502 being not exactly horizontal, but this does not prevent accurate tracking as long as the orientation is known from calibration or closed loop servo. A combination of rotation about an axis within a few degrees of vertical and elevation can get to any orientation needed for heliostat tracking or sun pointing.

Figure 24:
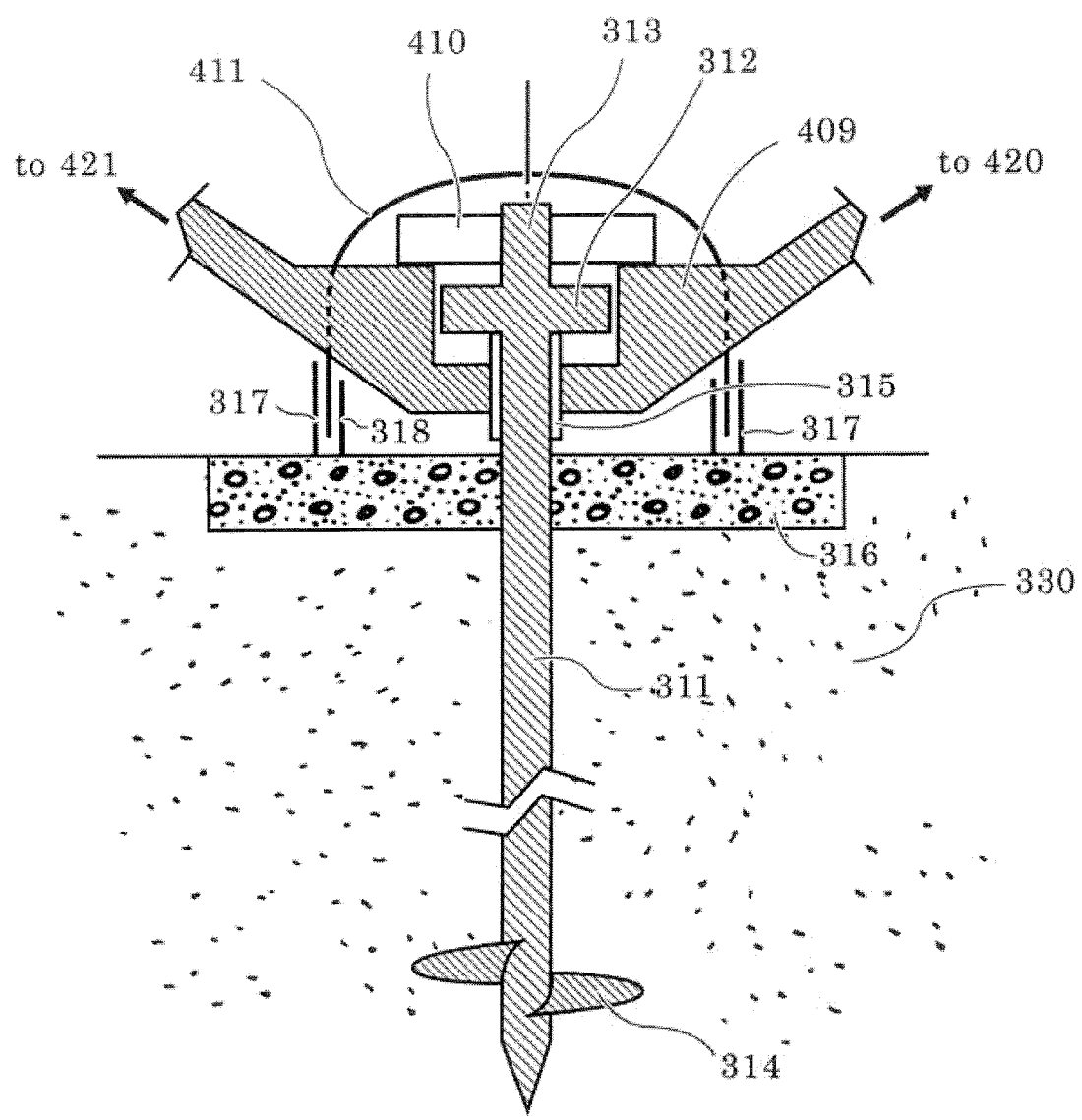
FIG. 24 shows a detail of the connection between the central ground anchor and the rotating structure.

FIG. 24 shows a preferred embodiment of the lateral ground anchor and its connection to the lowest node 409 of the spaceframe structure, which connects via struts to the nodes 420, 421 and 422 of the spaceframe 400. The anchor 311 is a helical pier with the blade 314 deep in the ground 330. At its upper end the shaft 311 passes through a bushing 315, which may for example be of hard bearing plastic needing no oil, that transmits lateral forces from the node 409. A concrete disc 316 then transmits these forces into the ground 330. The node 409 is free to move vertically over the range needed to handle track irregularities, but in the event that a wind gust lifts one or more of the tracker wheels 406, 407 and 408 off the track 310, then further upward motion of the spaceframe structure 400 is prevented when the node 409 contacts the head 312 of the helical shaft 311.

The rotation angle of the tracker structure 400 with respect to the fixed helical anchor 311 is measured by the angular encoder 410 attached to the node 409. A top extension 313 of the helical anchor 311 provides the central angular reference. The bushing 315 and encoder 410 are protected from dirt by the cover 411 which form the central moving element of a labyrinth seal, with rings 317 and 318 forming the fixed elements.

Figure 25:
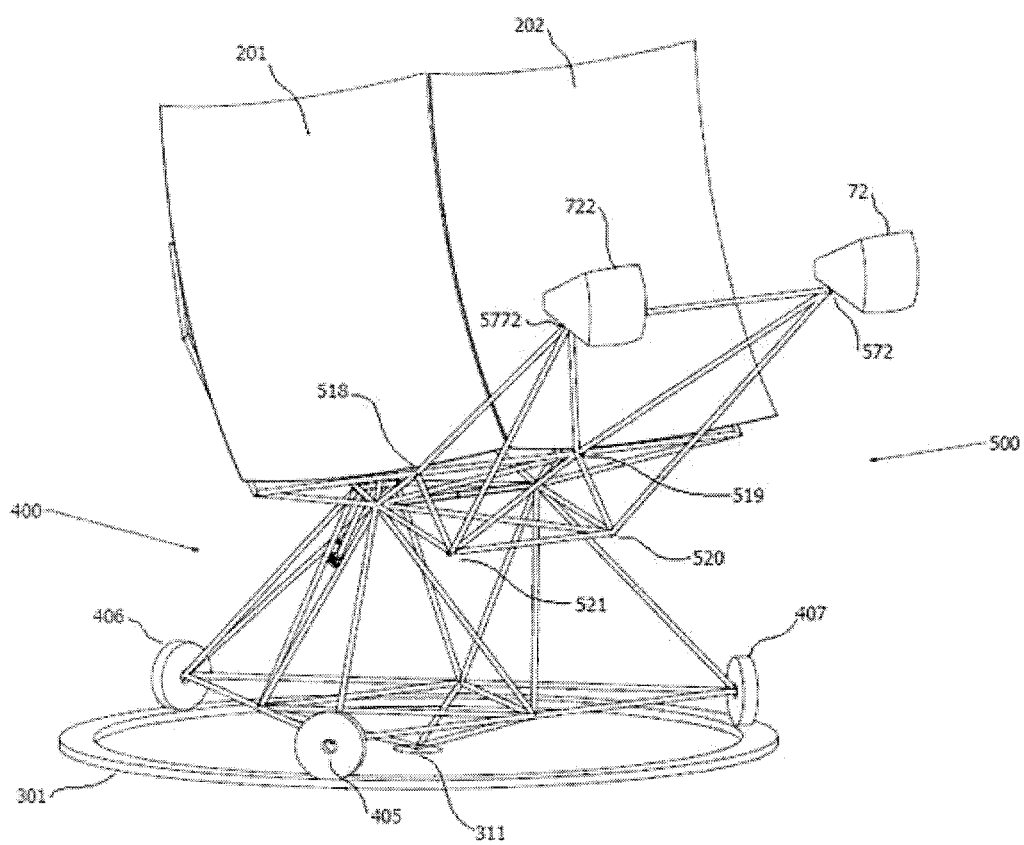
FIG. 25 shows a dual axis tracker carrying two dish reflectors and additions to the elevation structure to support fly's eye receivers.

FIG. 25 shows the same preferred embodiment as shown in FIG. 23 of a dual axis tracker according to this invention, except now adapted for two off-axis solar reflectors 201 and 202 powering fly's eye receivers 722 and 72. The tracker comprises the same lower rigid spaceframe structure 400 on a circular ground track 310, but in this embodiment the elevation spaceframe structure 500 is now extended out in front of the reflectors to nodes 5772 and 572, which hold in position the receivers 772 and 72. The nodes 5772 and 572 are connected by struts to the nodes 518, 519, 520 and 5212 that project below the lower edges of the reflectors 201 and 202, and which in turn are connected through the spaceframe structure 500 to its primary nodes 501 and 502 that define the elevation axis, and 503 and 504 adjacent to the elevation drive 600.

Those skilled in the art, after having the benefit of this disclosure, will appreciate that modifications and changes may be made to the embodiments described herein, different design parameters and materials may be substituted, equivalent features may be used, changes may be made in the assembly, and additional elements and steps may be added, all without departing from the scope and spirit of the invention. This disclosure has set forth certain presently preferred embodiments and examples only, and no attempt has been made to describe every variation and embodiment that is encompassed within the scope of the present invention. The scope of the invention is therefore defined by the claims appended hereto, and it is not limited to the specific examples set forth in the above description.

TABLE 1

Optical prescription for a preferred example of the first stage concentrator

| | Surface type | Radius (mm) | Thickness (mm) | conic |
|---|---|---|---|---|
| 1 | Mirror (200) | −5000 | −2550 | −1 |
| 2 | Silica (lens 210 entrance) | 400 | −30 | 0 |
| 3 | Air (lens 210 exit) | 155 | −700 | 0 |
| 4 | Image (coincident with lens array 220) | 700 | — | 0 |

TABLE 2

Optical prescription for a second preferred example of the first stage concentrator

| # | Radius | Thickness | Material | Semi-Diameter | Conic | Decenter Y | Tilt About X |
|---|---|---|---|---|---|---|---|
| 0 | Infinity | Infinity | MIRROR | 0.000 | 0.000 | 0.000 | 0.000 |
| 1 | Infinity | 5000.000 | COORDBRK | 5065.454 | 0.000 | 0.000 | 0.000 |
| 2 | −6000.000 | −3000.000 | SILICA | 5027.574 | −1.000 | 0.000 | 0.000 |
| 3 | Infinity | −90.000 | | | | −5.000 | −29.000 |
| 4 | Infinity | −29.000 | | 122.000 | 0.000 | 0.000 | 0.000 |
| 5 | 285.000 | −685.000 | | 122.000 | 0.000 | 0.000 | 0.000 |
| 6 | 850.000 | 0.000 | | 636.013 | 0.000 | 0.000 | 0.000 |

What is claimed is:

1. An apparatus for generating electricity from solar radiation comprising:

a dish reflector having a focus;

a fly's eye receiver held near said focus, including:

a field lens that concentrates sunlight into an image of said dish reflector;

a two-dimensional fly's eye array of contiguous convex lenses extending across said image;

a photovoltaic cell behind each convex lens of the fly's eye array, configured to receive light further concentrated by said convex lens; and a structure configured to support and cool said photovoltaic cells; and a dual axis tracking structure configured to hold said dish reflector and said fly's eye receiver in co-alignment and oriented to the sun;

wherein the photovoltaic cells are configured to convert said sunlight into electricity after being concentrated and divided between said photovoltaic cells in two imaging stages: in the first stage, said dish reflector and said field lens are together operative to concentrate the sunlight entering the apparatus in the form of the image of said dish, stabilized against pointing errors of said dual axis tracking structure, and in the second stage, said fly's eye array of contiguous convex lenses is operative to divide the sunlight energy of said image into portions, one per convex lens, each portion being further concentrated by said convex lens onto the photovoltaic cell behind said convex lens.

2. The apparatus for generating electricity from solar radiation of claim 1, wherein said dish reflector has the shape of a concave paraboloid with off-axis focus located to one side of the entering sunlight, so that said fly's eye receiver does not significantly block incoming sunlight.

3. The apparatus for generating electricity from solar radiation of claim 1, wherein the contiguous convex lenses in said fly's eye receiver are individually sized with the areas needed so that the portions of sunlight power from said image transmitted and further concentrated are equal.

4. The apparatus for generating electricity from solar radiation of claim 3, wherein the convex lenses in said fly's eye array each have focal length in proportion to their width, such that they all form images of the sun of close to the same diameter, and the linear displacements of said images are all the same for a given mispointing angle.

5. The apparatus for generating electricity from solar radiation of claim 1, wherein said array of contiguous lenses has overall a concave, approximately spherical shape to better coincide with said pupil image, the center of said sphere being near said field lens, and the radius of said sphere being such that when the apparatus is correctly oriented to the sun, the light strikes each of the lenses in the array at close to normal angle of incidence, i.e. parallel to the lens axis.

6. The apparatus for generating electricity from solar radiation of claim 1, further comprising a tertiary optical element in the form of a dome lens introduced just ahead of each cell, wherein said dome lens is operative to more evenly distribute the light focused by the fly's eye lens element onto the cell and to increase tolerance to mispointing.

7. The apparatus for generating electricity from solar radiation of claim 1, further comprising a tertiary optical element in the form of an optical funnel introduced just ahead of each cell, wherein said funnel is operative to more evenly distribute the light focused by the fly's eye lens element onto the cell and to increase tolerance to mispointing.

8. The apparatus for generating electricity from solar radiation of claim 1, wherein said fly's eye receiver is sealed against contamination, by said field lens at its entrance and by a continuous concave bowl supporting the multiplicity of cells at its rear.

9. The apparatus for generating electricity from solar radiation of claim 1, wherein said cells are supported by a thermally conductive bowl with a multiplicity of finned heatsinks behind, said heatsinks being cooled by forced air convection.

10. The apparatus for generating electricity from solar radiation of claim 1, wherein said cells are supported by a thermally conductive bowl cooled from behind by thermal transfer liquid pumped to a radiator or for use as a source of solar thermal power.

11. The apparatus for generating electricity from solar radiation of claim 1, wherein said field lens is made of fused silica coated by two or more successively deposited sol-gel layers of different density and thickness, operative to form a broad-band antireflection coating.

12. The apparatus for generating electricity from solar radiation of claim 1, wherein the lenses of the fly's eye array are made of glass which has been heat treated to cause phase separation, and chemically leached so as to reduce surface reflection over a broad spectral band.

13. The apparatus for generating electricity from solar radiation of claim 1, further comprising one or more dish/receiver units as described above, supported on a dual-axis tracking mount, said mount being adapted to position said unit or units toward the sun and to track the movement of the sun across the sky so that solar radiation from the sun illuminates said dish-shaped reflectors and is reflected from said dish-shaped reflectors toward said field lenses associated with each said dish-shaped reflector.

\* \* \* \* \*